United States Patent
Wang et al.

(10) Patent No.: US 11,545,069 B2
(45) Date of Patent: Jan. 3, 2023

(54) DISPLAY DEVICE HAVING A SHIFT REGISTER HAVING INTERDIGITAL TRANSISTOR

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Xiaoyuan Wang, Beijing (CN); Yan Fang, Beijing (CN); Wu Wang, Beijing (CN); Guangdi Cao, Beijing (CN); Wenlong Feng, Beijing (CN)

(73) Assignees: CHONGQING BOE OPTOELECTRONICS TECHNOLOGY CO., LTD., Chongqing (CN); BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 0 days.

(21) Appl. No.: 17/053,056

(22) PCT Filed: Oct. 18, 2019

(86) PCT No.: PCT/CN2019/111921
§ 371 (c)(1),
(2) Date: Nov. 4, 2020

(87) PCT Pub. No.: WO2021/072737
PCT Pub. Date: Apr. 22, 2021

(65) Prior Publication Data
US 2021/0375186 A1 Dec. 2, 2021

(51) Int. Cl.
*G09G 3/20* (2006.01)

(52) U.S. Cl.
CPC ... *G09G 3/2092* (2013.01); *G09G 2300/0842* (2013.01); *G09G 2310/0286* (2013.01)

(58) Field of Classification Search
CPC ......... G09G 3/3677; G09G 2310/0286; G09G 3/3266
See application file for complete search history.

(56) References Cited

U.S. PATENT DOCUMENTS

| | | | |
|---|---|---|---|
| 9,799,574 B2* | 10/2017 | Xu | H01L 29/41733 |
| 2003/0016308 A1* | 1/2003 | Jeon | G02F 1/13454 |
| | | | 349/39 |

(Continued)

FOREIGN PATENT DOCUMENTS

| | | |
|---|---|---|
| CN | 101217154 A | 7/2008 |
| CN | 103681875 A | 3/2014 |

(Continued)

*Primary Examiner* — Sepehr Azari
(74) *Attorney, Agent, or Firm* — Brooks Kushman P.C.

(57) ABSTRACT

A display panel is provided. The display panel includes at least one transistor of a split structure. The transistor of the split structure comprises a control electrode, a first electrode and a second electrode; the first electrode comprises N first electrode portions, the second electrode comprises N second electrode portions, and N is an integer greater than 2; the N first electrode portions are electrically coupled, and the N second electrode portions are electrically coupled; the display panel has a plurality of transistor regions arranged at intervals, an n-th first electrode portion and an n-th second electrode portion are located in a same transistor region, an m-th first electrode portion and an (m+1)-th first electrode portion are respectively located in two adjacent transistor regions, n and m are an positive integers, n is less than or equal to N, and m is less than or equal to N−1.

20 Claims, 9 Drawing Sheets

(56) References Cited

U.S. PATENT DOCUMENTS

| | | | | |
|---|---|---|---|---|
| 2003/0222311 A1* | 12/2003 | Kim | ................ | G02F 1/13439 257/347 |
| 2010/0225621 A1* | 9/2010 | Jung | ................ | G09G 3/3677 345/204 |
| 2011/0012880 A1* | 1/2011 | Tanaka | ............ | H01L 27/1214 345/211 |
| 2012/0162286 A1* | 6/2012 | Toyotaka | ........ | G09G 3/3648 345/690 |
| 2015/0070616 A1* | 3/2015 | Ogasawara | ...... | G02F 1/1368 349/43 |
| 2015/0268523 A1* | 9/2015 | Ochiai | ............ | G11C 19/28 257/71 |
| 2015/0301415 A1* | 10/2015 | Sawada | ........ | G02F 1/134336 349/147 |
| 2016/0370630 A1* | 12/2016 | Jung | ................ | G09G 3/3677 |
| 2021/0183317 A1* | 6/2021 | Hu | ................ | G09G 3/3233 |

FOREIGN PATENT DOCUMENTS

| | | |
|---|---|---|
| CN | 109473450 A | 3/2019 |
| CN | 110058465 A | 7/2019 |
| KR | 1020070034380 A | 3/2007 |

\* cited by examiner

DISPLAY DEVICE HAVING A SHIFT REGISTER HAVING INTERDIGITAL TRANSISTOR

CROSS-REFERENCE TO RELATED APPLICATION

This application is the U.S. national phase of PCT Application No. PCT/CN2019/111921 filed on Oct. 18, 2019, which is incorporated herein by reference in its entirety.

TECHNICAL FIELD

The present disclosure relates to the field of display technologies, and in particular to a display panel.

BACKGROUND

In the related technologies, in the production of display panels, it is easy to cause short circuits due to insufficient exposure, when large-sized transistors are manufactured in a GOA (Gate On Array, gate driving circuit provided on array substrate) area.

SUMMARY

In an aspect, an embodiment of the present disclosure provides a display panel including at least one transistor of a split structure. Each of the at least one transistor of the split structure includes a control electrode, a first electrode and a second electrode;

the first electrode includes N first electrode portions, the second electrode includes N second electrode portions, and N is an integer greater than 2;

the N first electrode portions are electrically coupled, and the N second electrode portions are electrically coupled;

the display panel has a plurality of transistor regions arranged at intervals, an n-th first electrode portion and an n-th second electrode portion are located in a same transistor region, an m-th first electrode portion and an (m+1)-th first electrode portion are respectively located in two adjacent transistor regions, each of n and m is an positive integer, n is less than or equal to N, and m is less than or equal to N−1.

Optionally, the display panel according to at least one embodiment of the present disclosure further includes a gate driving circuit, and the gate driving circuit includes a plurality of cascaded shift register units; and at least one transistor included in the plurality of shift register units is the transistor of the split structure.

Optionally, each of the plurality of shift register units includes a gate drive signal output terminal, an input terminal and a clock signal line; and the first electrode of each of the at least one transistor of the split structure or the second electrode of each of the at least one transistor of the split structure is electrically coupled with the gate drive signal output terminal, the input terminal or the clock signal terminal.

Optionally, each of the plurality of shift register units includes an output transistor, an output pull-down transistor, an input transistor, an input reset transistor, and a storage capacitor;

a control electrode of the output transistor is electrically coupled with a pull-up node, a first electrode of the output transistor is electrically coupled with a clock signal line, and a second electrode of the output transistor is electrically coupled with a gate drive signal output terminal;

a control electrode of the output pull-down transistor is electrically coupled with a reset terminal, a first electrode of the output pull-down transistor is electrically coupled with the gate drive signal output terminal, and a second electrode of the output pull-down transistor is electrically coupled with a first voltage terminal;

a control electrode of the input transistor and a first electrode of the input transistor are electrically coupled with an input terminal, and a second electrode of the input transistor is electrically coupled with the pull-up node;

a control electrode of the input reset transistor is electrically coupled with the reset terminal, a first electrode of the input reset transistor is electrically coupled with the pull-up node, and a second electrode of the input reset transistor is electrically coupled with the first voltage terminal;

a first electrode plate of the storage capacitor is electrically coupled with the control electrode of the output transistor, and a second electrode plate of the storage capacitor is electrically coupled with the second electrode of the output transistor; and at least one of the output transistor, the output pull-down transistor, the input transistor, or the input reset transistor is the transistor of the split structure.

Optionally, the storage capacitor included in each of the plurality of shift register units includes a first electrode plate and a second electrode plate, and the second electrode plate includes at least one electrode plate portion; and the at least one electrode plate portion is adjacent to at least one of the plurality of transistor regions.

Optionally, the display panel has a plurality of capacitor regions arranged at intervals, the second electrode plate includes a plurality of electrode plate portions, and each of the plurality of electrode plate portions is located in one of the plurality of capacitor regions.

Optionally, at least one of the plurality of transistor regions is located between adjacent capacitor regions; or, at least one of the plurality of capacitor regions is located between adjacent transistor regions.

Optionally, the transistor region where the first electrode included in the same transistor of the split structure is located and the capacitor region are alternately arranged.

Optionally, each of the plurality of shift register units includes an output transistor, one of the at least one transistor of the split structure is the output transistor, and a second electrode of the output transistor is electrically coupled with the gate drive signal output terminal; and the first electrode plate and a gate electrode of the output transistor are arranged in a same layer; the second electrode plate and a first electrode of the output transistor are arranged in a same layer.

Optionally, an absolute value of a difference between lengths of any two of the plurality of transistor regions is less than a predetermined length difference; and the predetermined length difference is 1/d of a minimum of lengths of the plurality of transistor regions, d is a positive number, and d is greater than 5.

Optionally, the n-th first electrode portion includes A first sub-electrode portions, and the n-th second electrode portion includes B second sub-electrode portions; A-B is equal to 1 or −1; A and B are both positive integers; and the first sub-electrode portions and the second sub-electrode portions are alternately arranged, and a channel region is formed between each of the first sub-electrode portions and one of the second sub-electrode portions that are adjacent.

Optionally, the n-th first electrode portion is an interdigital electrode, and the n-th second electrode portion is an interdigital electrode; the n-th first electrode portion includes A comb-shaped first sub-electrode portions, and the n-th second electrode portion includes B comb-shaped second sub-electrode portions; A-B is equal to 1 or −1; A and B are both positive integers; and the first sub-electrode portions and the second sub-electrode portions are alternately arranged, and a channel region is formed between each of the first sub-electrode portions and one of the second sub-electrode portions that are adjacent.

Optionally, B is equal to A+1; each of the first sub-electrode portions included in the n-th first electrode portion is arranged between two second sub-electrode portions included in the n-th second electrode portion; and channel regions are formed between each of the first sub-electrode portions included in the n-th first electrode portion and the two second sub-electrode portions included in the n-th second electrode portion, respectively.

Optionally, the display panel includes a shift register unit, and the shift register unit includes a storage capacitor; the display panel has a plurality of capacitor regions arranged at intervals; the storage capacitor includes a first electrode plate and a second electrode plate, the second electrode plate includes a plurality of electrode plate portions, and each of the plurality of electrode plate portions is located in one of the plurality of capacitor regions;

the n-th first electrode portion and the n-th second electrode portion are both arranged in an n-th transistor region;

at least one of the plurality of capacitor regions is adjacent to the n-th transistor region; a second sub-electrode of the second sub-electrodes in the n-th transistor region is adjacent to an electrode plate portion in a capacitor region adjacent to the n-th transistor region; and a dummy channel region is formed between the electrode plate portion in the capacitor region adjacent to the n-th transistor region and the second sub-electrode portion in the n-th transistor region adjacent to the electrode plate portion.

Optionally, a shortest distance between two adjacent transistor regions is greater than a threshold distance; and the threshold distance is K times of a maximum width of a channel region, K is greater than or equal to 2, and less than or equal to 3, and K is a positive number.

In the display panel according to at least one embodiment of the present disclosure, a large-sized transistor is reduced into smaller pieces, so as to avoid a problem of short-circuit failure due to insufficient exposure when manufacturing large-sized transistors in the related technologies.

DETAILED DESCRIPTION

Figure 1A:
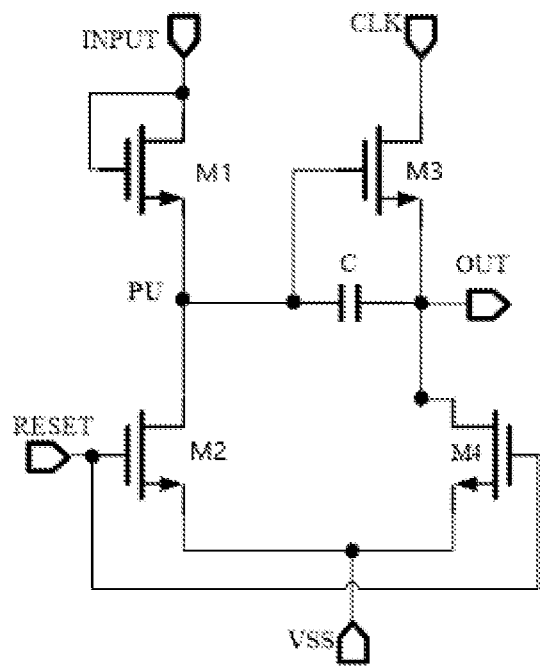
FIG. 1A is a circuit diagram of a stage of shift register unit included in a GOA (Gate On Array, a gate driving circuit provided on an array substrate) circuit according to at least one embodiment.

Technical solutions in embodiments of the present disclosure will be clearly and completely described below in conjunction with the accompanying drawings in the embodiments of the present disclosure. Obviously, the described embodiments are only a part of the embodiments of the present disclosure, not all of the embodiments. Based on the embodiments in the present disclosure, all other embodiments obtained by those of ordinary skill in the art without creative effort shall fall within the protection scope of the present disclosure.

A display panel according to at least one embodiment of the present disclosure includes at least one transistor of a split structure; the transistor of a split structure includes a gate electrode, a first electrode, and a second electrode;

the first electrode includes N first electrode portions, and the second electrode includes N second electrode portions, N being an integer greater than 2;

the N first electrode portions are electrically connected to each other, and the N second electrode portions are electrically connected to each other;

the display panel has a plurality of transistor regions arranged at intervals, the n-th first electrode portion and the n-th second electrode portion are located in a same transistor region, the m-th first electrode portion and the (m+1)-th first electrode portion are respectively located in two adjacent transistor regions; n and m are positive integers, n is less than or equal to N, and m is less than or equal to N−1.

In the display panel according to at least one embodiment of the present disclosure, the first electrode of the transistor of the split structure is configured to include N first electrode portions, and the second electrode of the transistor of the split structure is configured to include N second electrode portions. The n-th first electrode portion and the n-th second electrode portion are arranged in the same transistor region, and different transistor regions are arranged at intervals to reduce the large-sized transistors into small pieces, so as to avoid a situation where short circuits tends to occur due to insufficient exposure, in the production of the large-sized transistor In the related technologies.

In at least one embodiment of the present disclosure, the transistor of a split structure refers to: the first electrode of the transistor is split into N first electrode portions (the N first electrode portions are electrically coupled), the second electrode of the transistor is split into N second electrode portions (the N second electrode portions are electrically coupled), and the n-th first electrode portion and the n-th second electrode portion are both arranged in the n-th transistor region (the N transistor regions are arranged at intervals). However, the present disclosure is not limited thereto.

In at least one embodiment of the present disclosure, a shortest distance between two adjacent transistor regions may be greater than a threshold distance. The threshold distance may be K times a maximum width of a channel region, K is greater than or equal to 2, and is less than or equal to 3, and K is a positive number.

For example, the threshold distance may be greater than or equal to 10 microns, but is not limited to this.

In at least one embodiment of the present disclosure, the first electrode may be a source electrode, and the second electrode may be a drain electrode; or, the first electrode may be a drain electrode, and the second electrode may be a source electrode. However, the present disclosure is not limited thereto.

In at least one embodiment of the present disclosure, that the n-th first electrode portion and the n-th second electrode portion are arranged in the same transistor region, and the m-th first electrode portion and the (m+1)-th first electrode portion are respectively located in two adjacent transistor regions may refer to:

when N is equal to 2, a first one of first electrode portions and a first one of second electrode portions are arranged in a first transistor region, and a second one of first electrode portions and a second one of second electrode portions are arranged in a second transistor region; the first transistor region is adjacent to the second transistor region;

when N is equal to 3, a first one of first electrode portions and a first one of second electrode portions are arranged in a first transistor region, a second one of first electrode portions and a second one of second electrode portions are arranged in a second transistor region, and a third one of first electrode portions and a third one of second electrode portions are arranged in a third transistor region; the first transistor region is adjacent to the second transistor region, and the second transistor region is adjacent to the third transistor region; and when N is equal to 4, a first one of first electrode portions and a first one of second electrode portions are arranged in a first transistor region, and a second one of first electrode portions and a second one of second electrode portions are arranged in a second transistor region, a third one of first electrode portions and a third one of second electrode portions are provided in a third transistor region, and a fourth one of first electrode portions and a fourth one of second electrode portions are provided in a fourth transistor region; the first transistor region is adjacent to the second transistor region, the second transistor region is adjacent to the third transistor region, and the third transistor region is adjacent to the fourth transistor region.

That is, each of the N first electrode portions and one of the N-th second electrode portions are arranged in the corresponding transistor region.

According to at least one embodiment of the present disclosure, a source and drain metal pattern included in the transistor of the split structure are split into segments, that is, splitting the first electrode into at least two first electrode portions, and splitting the drain electrode of the transistor of the split structure into at least two second electrode portions, so as to reduce the large-sized transistor into small pieces.

Optionally, the display panel according to at least one embodiment of the present disclosure may further include a gate driving circuit, and the gate driving circuit includes a plurality of cascaded shift register units; and at least one transistor included in the shift register unit is the transistor of the split structure.

In a specific implementation, the gate driving circuit may be arranged in a GOA (Gate On Array, a gate driving circuit arranged on an array substrate) area. The shift register unit described in at least one embodiment of the present disclosure can avoid large-area photoresists and large-area weak exposure areas from occurring in the GOA area, so as to improve process uniformity, increase a range of fluctuations in the process, and improve product yield and quality.

In at least one embodiment of the present disclosure, the first electrode of the transistor of the split structure and the second electrode of the transistor of the split structure may be located on a same layer, that is, the first electrode of the transistor of the split structure and the second electrode of the transistor of the split structure may be made by a same patterning process.

In the related technologies, the GOA (Gate On Array, gate driving circuit provided on array substrate) area is provided with a large number of TFTs (thin film transistors), and has the process environment (including exposure, development and etching, etc.) of the GOA area different from other areas, where process defects such as short circuit and open circuit (short circuit or open circuit) easily occur. Particularly, some TFTs (such as the output transistor) are relatively large in size, when process fluctuations cause poor uniformity, defects such as short circuits are likely to occur, which affects the yield of display products. Based on this, in the display panel according to at least one embodiment of the present disclosure, the first electrode of the transistor of the split structure in the GOA area is configured to include N first electrode portions, and the second electrode of the transistor of the split structure in the GOA area is configured to include N second electrode portions, so as to reduce the large-sized transistor into small pieces.

Optionally, the shift register unit may further include a gate drive signal output terminal, an input terminal and a clock signal line; the first electrode of the transistor of the split structure or the second electrode of the transistor of the split structure is electrically connected to the gate drive signal output terminal, the input terminal or the clock signal terminal.

In a specific implementation, a transistor that is used for charging and discharging and included in the shift register unit is generally of relatively large size, thus the transistor used for charging and discharging may be a transistor of the split structure. The first electrode of the transistor of the split structure or the second electrode of the transistor of the split structure may be electrically connected to the gate drive signal output terminal, and the first electrode of the transistor of the split structure or the second electrode of the transistor of the split structure may be electrically connected to the input terminal, or the first electrode of the transistor of the split structure or the second electrode of the transistor of the split structure may also be electrically connected to the clock signal terminal, but they are not limited thereto.

Optionally, the shift register unit according to at least one embodiment may include an output transistor, an output pull-down transistor, an input transistor, an input reset transistor, and a storage capacitor;

a control electrode of the output transistor is electrically coupled to a pull-up node, a first electrode of the output transistor is electrically coupled to the clock signal line, and a second electrode of the output transistor is electrically coupled to the gate drive signal output terminal;

a control electrode of the output pull-down transistor is electrically coupled to a reset terminal, a first electrode of the output pull-down transistor is electrically coupled to the gate drive signal output terminal, and a second electrode of the output pull-down transistor is electrically coupled to a first voltage terminal;

a control electrode of the input transistor and a first electrode of the input transistor are electrically coupled to the input terminal, and a second electrode of the input transistor is electrically coupled to the pull-up node;

a control electrode of the input reset transistor is electrically coupled to the reset terminal, a first electrode of the input reset transistor is electrically coupled to the pull-up node, and a second electrode of the input reset transistor is electrically coupled to the first voltage terminal;

a first electrode plate of the storage capacitor is electrically coupled with the control electrode of the output transistor, and a second electrode plate of the storage capacitor is electrically coupled with the second electrode of the output transistor; and at least one of the output transistor, the output pull-down transistor, the input transistor, or the input reset transistor is the transistor of the split structure.

Optionally, the shift register unit may include a storage capacitor, the storage capacitor may have a first electrode plate and a second electrode plate, and the second electrode plate may include at least one electrode plate portion; the at least one electrode plate portion is adjacent to at least one of the transistor regions.

According to at least one embodiment of the present disclosure, a large-sized storage capacitor is reduced into smaller pieces, so as to avoid the problem of short-circuit failure due to insufficient exposure when manufacturing large-sized storage capacitors in the related technologies.

Optionally, the display panel according to at least one embodiment of the present disclosure may have a plurality of capacitor regions arranged at intervals, the second electrode plate includes a plurality of electrode plate portions, and each of the plurality of electrode plate portions is located in one of the plurality of capacitor regions.

Optionally, at least one of the transistor regions is located between adjacent capacitor regions; or, at least one of the capacitor regions is located between adjacent transistor regions.

That each of the plurality of electrode plate portions is located in one of the plurality of capacitor regions may mean that the display panel has P capacitor regions, the second electrode plate includes P electrode plate portions, and the p-th electrode plate portion is located within the p-th capacitor region, but not limited to this.

In at least one embodiment of the present disclosure, P may be an integer greater than 1, and p is a positive integer less than or equal to P, but it is not limited thereto.

Optionally, transistor regions where a first electrode included in one transistor of the split structure is located and capacitor regions are alternately arranged.

Optionally, the shift register unit may include an output transistor; one transistor of the split structure is the output transistor, and a second electrode of the output transistor is electrically connected to the gate drive signal output terminal; the first electrode plate and a gate electrode of the output transistor are arranged in a same layer; the second electrode plate and a first electrode of the output transistor are arranged in a same layer.

In a specific implementation, the first electrode plate and the gate electrode of the output transistor may be an integral structure, but it is not limited to this.

In at least one embodiment of the present disclosure, transistor regions where the first electrode included in the output transistor is located and the capacitor regions can be alternately arranged, so as to reduce the large-sized transistor and the large-sized storage capacitor into smaller pieces, thereby avoiding a short circuit failure due to insufficient exposure when fabricating large-sized transistors and large-sized storage capacitors in the related technologies, and avoiding a short circuit between a source electrode of the output transistor and the storage capacitor from occurring at a position where the storage capacitor and the output transistor are connected, due to the large area of photoresists at the storage capacitor, during exposure and development.

Optionally, the second electrode plate of the storage capacitor may be located on the same layer as the first electrode of the output transistor, but it is not limited to this.

That second electrode plate of the storage capacitor and the first electrode of the output transistor are located on the same layer means that the second electrode plate of the storage capacitor and the first electrode of the output transistor are manufactured by one patterning process.

As shown in FIG. 1A, the shift register unit according to at least one embodiment may include an output transistor M3, an output pull-down transistor M4, an input transistor M1, an input reset transistor M2, and a storage capacitor C.

A gate electrode of the output transistor M3 is electrically connected to a pull-up node PU, a source electrode of the output transistor M3 is electrically connected to a clock signal line CLK, and a drain electrode of the output transistor M3 is electrically connected to a gate drive signal output terminal OUT.

A gate electrode of the output pull-down transistor M4 is electrically connected to a reset terminal RESET, a source electrode of the output pull-down transistor M4 is electrically connected to the gate drive signal output terminal OUT, and a drain electrode of the output pull-down transistor M4 is electrically connected to a low voltage terminal; the low voltage terminal is used to provide a low voltage VSS.

A gate electrode of the input transistor M1 and a source electrode of the input transistor M1 are electrically coupled to an input terminal INPUT, and a drain electrode of the input transistor M1 is electrically coupled to the pull-up node PU.

A gate electrode of the input reset transistor M2 is electrically connected to the reset terminal RESET, a source electrode of the input reset transistor M2 is electrically connected to the pull-up node PU, and a drain electrode of the input reset transistor M2 is electrically connected to the low voltage terminal.

A first electrode plate of the storage capacitor C is electrically connected to the gate electrode of the output transistor M3, and a second electrode o plate of the storage capacitor C is electrically connected to the drain electrode of the output transistor M3.

At least one of the output transistor M3, the output pull-down transistor M4, the input transistor M1, or the input reset transistor M2 is the transistor of the split structure.

In at least one embodiment of the shift register unit shown in FIG. 1A, all transistors are n-type thin film transistors, the control electrode is a gate electrode, the first electrode is a source electrode, and the second electrode is a drain electrode, the first voltage terminal is the low voltage terminal. However, the present disclosure is not limited herein.

In at least one embodiment of the present disclosure, the output transistor M3 is a transistor for outputting a gate drive signal, and the size of the output transistor is relatively large. The gate electrode of the output transistor M3 is electrically connected to the first electrode plate of the storage capacitor C (or, the gate electrode of the output transistor M3 and the first electrode plate of the storage capacitor C are an integrated structure), all of N first source portions included by the source electrode of the output transistor M3 and N first drain portions included by the drain electrode of the output transistor may be provided in N transistor regions. The n-th first source portion included in the source electrode of the output transistor and the n-th first drain portion included in the drain electrode of the output transistor may be arranged in the n-th transistor region. The second electrode plate of the storage capacitor may include P electrode plate portions, and the P electrode plate portions may all be arranged in P capacitor regions. The p-th electrode plate portion included in the second electrode plate of the storage capacitor may be arranged in the p-th capacitor region.

In at least one embodiment of the present disclosure, P may be an integer greater than 1, and p is a positive integer less than or equal to P, but they are not limited thereto.

In at least one embodiment of the present disclosure, transistor regions and capacitor regions may be arranged alternately. For example, when there are three transistor regions and four capacitor regions, all the regions may be arranged from left to right as follows: the first capacitor region, the first transistor region, the second capacitor region, the second transistor region, the third capacitor region, the third transistor region, and the fourth capacitor region are arranged at intervals from left to right.

Figure 1B:
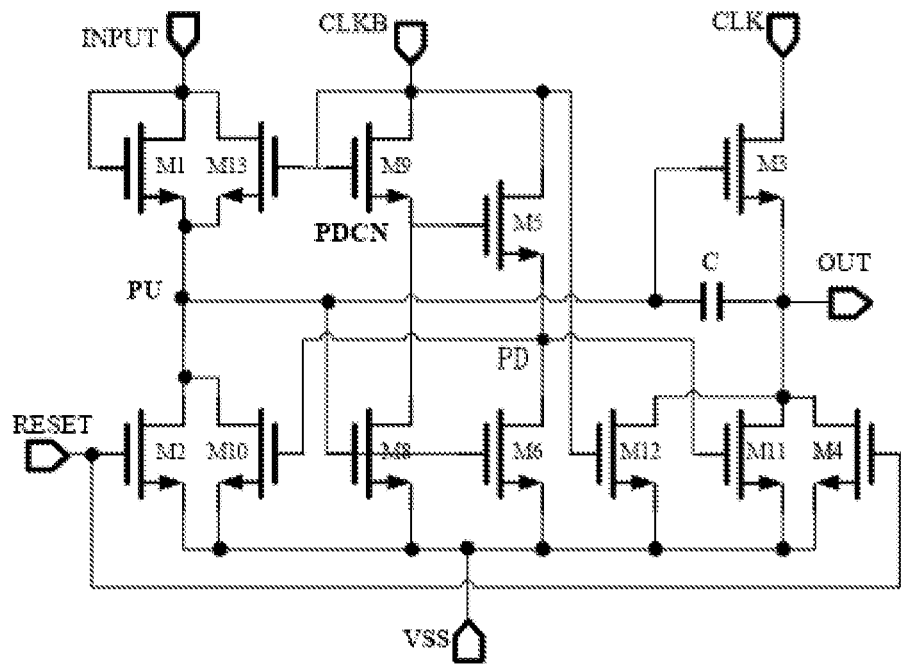
FIG. 1B is a circuit diagram of a stage of shift register unit included in a GOA (Gate On Array, a gate driving circuit provided on an array substrate) circuit according to at least one embodiment.

As shown in FIG. 1B, a stage of stage shift register unit included in the GOA circuit according to at least one embodiment may include an input transistor M1, an input reset transistor M2, an output transistor M3, an output pull-down transistor M4, a first pull-up control transistor M13, a second pull-up control transistor M10, a first pull-down control transistor M9, a second pull-down control transistor M8, a third pull-down control transistor M3, a fourth pull-down control transistor M6, a pull-down transistor M11, an output reset transistor M11, and a storage capacitor C.

A gate electrode of M1 and a source electrode of M1 are both electrically connected to an input terminal INPUT, and a drain electrode of M1 is electrically connected to a pull-up node PU.

A gate electrode of M3 is electrically connected to a first electrode plate of the storage capacitor C, a source electrode of M3 is electrically connected to a clock signal line CLK, a drain electrode of M3 is electrically connected to a second electrode plate of the storage capacitor C, and the drain electrode of M3 is also electrically connected to a gate drive signal output terminal OUT.

A gate electrode of M4 is electrically connected to a reset terminal RESET, a source electrode of M4 is electrically connected to the gate drive signal output terminal OUT, and a drain electrode of M4 is electrically connected to a low voltage terminal; the low voltage terminal is used to provide a low voltage VSS.

A gate electrode of M2 is electrically connected to the reset terminal RESET, a source electrode of M2 is electrically connected to the pull-up node PU, and a drain electrode of M2 is connected to the low voltage VSS.

A gate electrode of M13 is electrically connected to a clock signal terminal CLKB, a source electrode of M13 is electrically connected to the input terminal INPUT, and a drain electrode of M13 is electrically connected to the pull-up node PU;

A gate electrode of M9 and a source electrode of M9 are electrically coupled to the clock signal terminal CLKB, and a drain electrode of M9 is electrically coupled to a pull-down control node PDCN.

A gate electrode of M8 is electrically connected to the pull-up node PU, a source electrode of M8 is electrically connected to the pull-down control node PDCN, and a drain electrode of M8 is connected to the low voltage VSS.

A gate electrode of M5 is electrically connected to the pull-down control node PDCN, a source electrode of M5 is electrically connected to the clock signal terminal CLKB, and a drain electrode of M5 is electrically connected to a pull-down node PD.

A gate electrode of M6 is electrically connected to the pull-up node PU, a source electrode of M6 is electrically connected to the pull-down node PD, and a drain electrode of M6 is connected to VSS.

A gate electrode of M12 is electrically connected to the clock signal terminal CLKB, a source electrode of M12 is electrically connected to the gate drive signal output terminal OUT, and a drain electrode of M12 is connected to the low voltage VSS.

A gate electrode of M11 is electrically connected to the pull-down node PD, a source electrode of M11 is electrically connected to the gate drive signal output terminal, and a drain electrode of M11 is connected to the low voltage VSS.

A gate electrode of M10 is electrically connected to the pull-down node PD, a source electrode of M10 is electrically connected to the pull-up node PU, and a drain electrode of M10 is connected to the low voltage VSS.

In at least one embodiment of the shift register unit shown in FIG. 1B, all the transistors are n-type thin film transistors, but they are not limited thereto.

In at least one embodiment of the shift register unit shown in FIG. 1B, the first electrode is a source electrode, and the second electrode is a drain electrode.

In the related technologies, for amorphous silicon display products, in order to ensure a charging rate, the size of M3 is relatively large. Generally, a channel length of M3 may be several thousand microns, and the size of M3 in large-sized and high-resolution TV products is even larger than 10,000 microns. When using a semi-transparent film plate to manufacture a thin film transistor, the quantity of light exposure is weak in the middle of the large-area thin film transistor, and it is easy to be underexposed to cause short circuit failure, especially slight short circuits, which are not easy to be detected during the Array (array) process, and may cause failure to GOA and result in defects during using the display product, due to long-time loading of signals, heat generation, or signals affecting slight short-circuit positions. Moreover, at the junction of the storage capacitor and the output transistor, during exposure and development, there is a large area of photoresists at the storage capacitor. During the process, the photoresist is thermally expanded, which easily causes short circuit to occur between the output transistor and the storage capacitor. Furthermore, in at least one embodiment of the shift register unit shown in FIG. 1B, M1 is used for charging, and M4 is used for discharging, thus the size of M4 and the size of M1 may also be relatively large.

In the related technologies, in the production of display panels, in the GOA (Gate On Array, gate driving circuit provided on array substrate) area, when fabricating large-sized transistors and large-sized storage capacitors, it is easy to form a short circuit due to insufficient exposure, and at a position where the storage capacitor and the output transistor are connected, during exposure and development, a source electrode of the output transistor and the storage capacitor may be short-circuited due to the large area of photoresists at the storage capacitor. In view of this, in the shift register unit described in at least one embodiment of the present disclosure, the first electrode of the output transistor is configured to include N first electrode portions, the second electrode of the output transistor is configured to include N second electrode portions, the second electrode plate of the storage capacitor is configured to include P electrode plate portions, both the n-th first electrode portion and the n-th second electrode portion are arranged in the n-th transistor region, the p-th electrode plate portion is arranged in the p-th capacitor region, and the transistor regions and the capacitor regions are alternately arranged to divide the large-sized transistor and the large-sized storage capacitor into small pieces, so as to avoid a short circuit failure due to insufficient exposure when fabricating large-sized transistors and large-sized storage capacitors in the related technologies, and to avoid a short circuit between a source electrode of the output transistor and the storage capacitor from occurring at a position where the storage capacitor and the output transistor are connected, due to the large area of photoresists at the storage capacitor, during exposure and development.

According to at least one embodiment of the present disclosure, a source and drain metal pattern included in the output transistor are split into segments, that is, splitting the first electrode of the output transistor into at least two first electrode portions, splitting the second electrode of the output transistor into at least two second electrode portions, splitting the second electrode plate of the storage capacitor into segments, thereby reducing the large-sized transistor and the large-sized storage capacitor into smaller pieces.

In at least one embodiment of the present disclosure, a gate metal layer, a gate insulating layer, an active layer, and a source-drain metal layer may be fabricated on a base substrate in sequence. The source-drain metal layer includes the first electrode of the transistor, the second electrode of the transistor and the second electrode plate of the storage capacitor. A channel region is formed between a first sub-electrode portion and a second sub-electrode portion that are adjacent, and the active layer includes a channel portion and a doped portion. An orthographic projection of the channel portion onto the base substrate overlaps an orthographic projection of the channel region onto the base substrate, and an orthographic projection of the doped portion onto the base substrate may overlap an orthographic projection of the first electrode of the transistor onto the base substrate, an orthographic projection of the second electrode of the transistor onto the base substrate, and an orthographic projection of the second electrode plate of the storage capacitor onto the base substrate, but are not limited to this.

In at least one embodiment of the present disclosure, no source/drain metal layer pattern is formed in the channel region.

Optionally, an absolute value of a difference between lengths of any two transistor regions is less than a predetermined length difference; the predetermined length difference is 1/d of a minimum of lengths of the plurality of transistor regions, d is a positive integer, and D may be greater than 5, but they are not limited to this.

In at least one embodiment of the present disclosure, the lengths of all the transistor regions may be set to be approximately equal to avoid the length of a certain transistor region from being too long, thereby avoiding the occurrence of a short-circuit failure due to insufficient exposure.

Optionally, the n-th first electrode portion may include A first sub-electrode portions, and the n-th second electrode portion may include B second sub-electrode portions; A-B is equal to 1 or −1; and A and B are both positive integers.

The first sub-electrode portions and the second sub-electrode portions are alternately arranged, and a channel region is formed between the first sub-electrode portion and the second sub-electrode portion that are adjacent.

In at least one embodiment of the present disclosure, in a transistor region, the first sub-electrode portion may be parallel to the second sub-electrode portion, and the adjacent first sub-electrode portion and second sub-electrode portion are arranged opposite to each other, but they are not limited thereto.

In at least one embodiment of the present disclosure, first sub-electrode portions included in a first electrode portion may be parallel to each other, and second sub-electrode portions included in a second electrode portion may be parallel to each other, but they are not limited thereto.

In at least one embodiment of the present disclosure, the n-th first electrode portion and the n-th second electrode portion may be interdigital electrodes.

The n-th first electrode portion includes A comb-shaped first sub-electrode portions, and the n-th second electrode portion includes B comb-shaped second sub-electrode portions; A-B is equal to 1 or −1; A and B are both positive integers.

The first sub-electrode portion and the second sub-electrode portion are alternately arranged, and a channel region is formed between each of the first sub-electrode portions and one of the second sub-electrode portions that are adjacent.

In specific implementation, both the n-th first electrode portion and the n-th second electrode portion may be inter-digital electrodes, first sub-electrode portions included in the n-th first electrode portion and second sub-electrode portions included in the n-th second electrode portion can be alternately arranged, and a channel region is formed between the first sub-electrode portion and the second sub-electrode portion that are adjacent.

According to a specific implementation, B may be equal to A+1. The first sub-electrode portion included in the n-th first electrode portion is arranged between two second sub-electrode portions included in the n-th second electrode portion. Channel regions are formed between each of the first sub-electrode portions comprised in the n-th first electrode portion and the two second sub-electrode portions comprised in the n-th second electrode portion, respectively.

Figure 2:
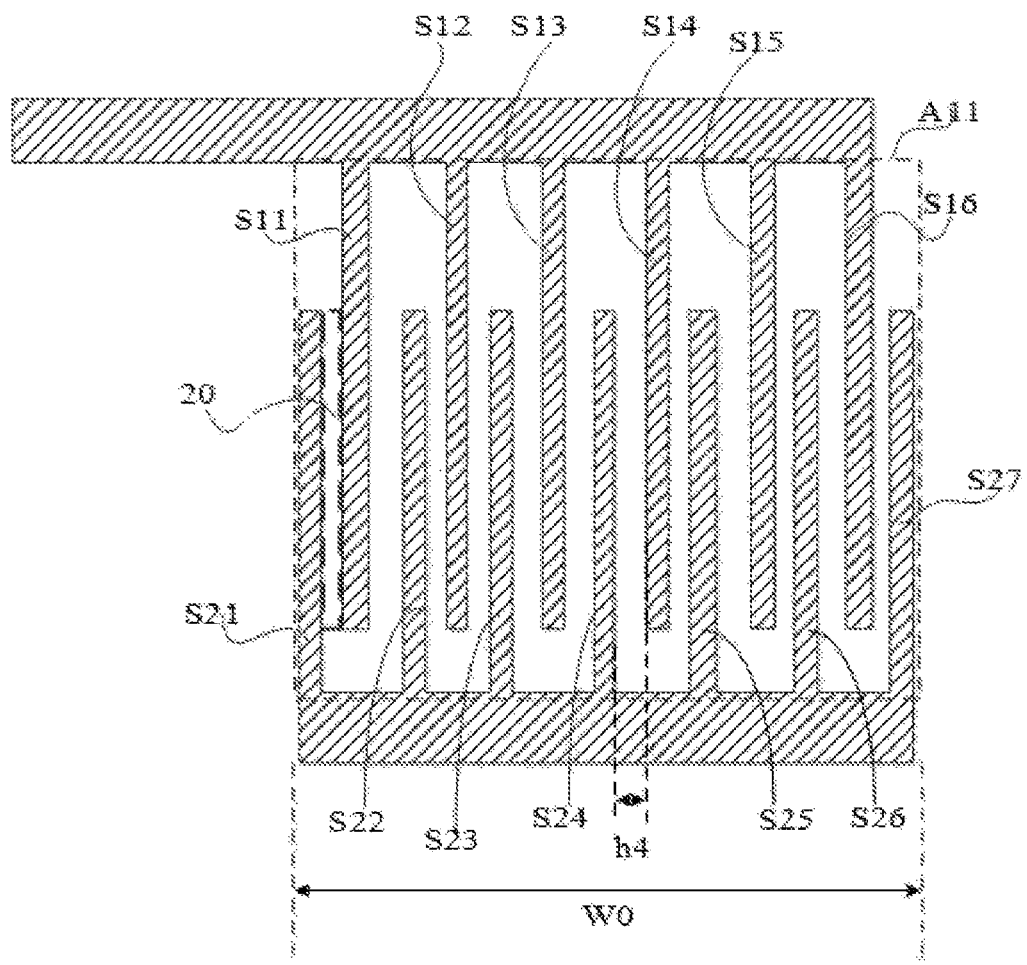
FIG. 2 is a schematic structural diagram of a first one of first electrode portions included in a transistor of a split structure in a shift register unit included in a display panel and a first one of second electrode portions included in the transistor according to at least one embodiment of the present disclosure.

As shown in FIG. 2, a first one of first electrode portions may include six first sub-electrode portions, and a first one of second electrode portions may include seven second sub-electrode portions;

the six first sub-electrode portions are: a first first sub-electrode portion S11, a second first sub-electrode portion S12, a third first sub-electrode portion S13, a fourth first sub-electrode portion S14, a fifth first sub-electrode portion S15, and a sixth first sub-electrode portion S16;

the seven second sub-electrode portions are: a first second sub-electrode portion S21, a second second sub-electrode portion S22, a third second sub-electrode portion S23, a fourth second sub-electrode portion S24, a fifth second sub-electrode portion S25, a sixth second sub-electrode portion S26, and a seventh second sub-electrode portion S27;

S11, S12, S13, S14, S15, S16, S21, S22, S23, S24, S25, S26 and S27 may be arranged in a first transistor region A11;

S11, S12, S13, S14, S15 and S16 are connected to each other, and S21, S22, S23, S24, S25, S26 and S27 are connected to each other;

S11 is arranged between S21 and S22, S12 is arranged between S22 and S23, S13 is arranged between S23 and S24, S14 is arranged between S24 and S25, S15 is arranged between S25 and S26, and S16 is arranged between S26 and S27.

A channel region is formed between S11 and S21, a channel region is formed between S11 and S22, a channel region is formed between S12 and S22, a channel region is formed between S12 and S23, and a channel region is formed between S13 and S23. A channel region is formed between S13 and S24, a channel region is formed between S14 and S24, a channel region is formed between S14 and S25, a channel region is formed between S15 and S25, and a channel region is formed between S15 and S26. A channel region is formed between S16 and S26, and a channel region is formed between S16 and S27.

In at least one embodiment shown in FIG. 2, S11, S12, S13, S14, S15, S16, S21, S22, S23, S24, S25, S26, and S27 may be parallel to each other, but not limited thereto.

In at least one embodiment shown in FIG. 2, a width of a channel region between S14 and S24 is labeled h4.

In at least one embodiment shown in FIG. 2, since S14 and S24 are parallel, the width of the channel region between S14 and S24 is a width of the channel region between S14 and S24 in a horizontal direction.

In at least one embodiment of the present disclosure, the width of the channel region may be a width of the channel region along an arrangement direction of the sub-electrodes, but is not limited to this.

For example, in the embodiment shown in FIG. 2, every sub-electrodes are arranged in the horizontal direction, and the width of the channel region may be the width of the channel region in the horizontal direction, but is not limited to this.

In at least one embodiment shown in FIG. 2, the adjacent first sub-electrode portion and second sub-electrode portion are arranged opposite to each other.

As shown in FIG. 2, S11 and S21 are arranged oppositely, and a first channel region 20 is formed between S11 and S21.

In FIG. 2, the length of A11 is labeled W0.

In at least one embodiment of the present disclosure, the length of the transistor region may be a length of the transistor region along a direction in which the sub-electrode portions are arranged. For example, in at least one embodiment shown in FIG. 2, all the sub-electrode portions are arranged in the horizontal direction, that is, arranged in sequence from left to right, the length of the transistor region may be a length of the transistor region along the horizontal direction, but is not limited to this.

Optionally, the display panel may include a shift register unit, the shift register unit includes a storage capacitor; the display panel has a plurality of capacitor regions that are spaced apart; the storage capacitor includes a first electrode plate and a second electrode plate. The second electrode plate includes a plurality of electrode plate portions, and each of the plurality of electrode plate portions is located in one of the plurality of capacitor regions. An n-th first electrode portion and an n-th second electrode portion are located in an n-th transistor region. At least one capacitor region is adjacent to the n-th transistor region; and one of the second sub-electrode portions in the n-th transistor region is adjacent to an electrode plate portion in a capacitor region adjacent to the n-th transistor region. A dummy channel region is formed between the electrode plate portion in the capacitor region adjacent to the n-th transistor region and the second sub-electrode portion in the n-th transistor region adjacent to the electrode plate portion.

In at least one embodiment of the present disclosure, when the n-th transistor region is adjacent to a capacitor region, a second sub-electrode portion in the n-th transistor region is adjacent to an electrode plate portion in the capacitor region; a dummy channel region may be formed between the second sub-electrode portion and the electrode plate portion.

Optionally, the dummy channel region is formed between the adjacent electrode plate portion and second sub-electrode portion, to improve the process uniformity of an edge effective channel.

It should be noted that if a conventional mask is used to fabricate a TFT, that is, when an active layer and a source and drain metal layer are fabricated with two separate masks, the active layer may include a dummy channel portion, and an orthographic projection of the dummy channel portion onto the base substrate overlaps an orthographic projection of the dummy channel region onto the base substrate; or the active layer may not include a dummy channel portion. In at least one embodiment of the present disclosure, a structure of the dummy channel portion may be the same as a structure of the channel portion, but is not limited thereto.

In addition, if the active layer and the source and drain metal layer are fabricated by a same semi-transparent mask, the active layer may include a dummy channel portion, and an orthographic projection of the dummy channel portion onto the base substrate overlaps the orthographic projection of the dummy channel region onto the base substrate.

In either one of the above cases, two poles of the "dummy channel portion" are the second sub-electrode portion and the electrode plate portion of the capacitor, and do not include "first sub-electrode portion". Therefore, the dummy channel portion does not have a channel function, but to increase the process uniformity.

Figure 3:
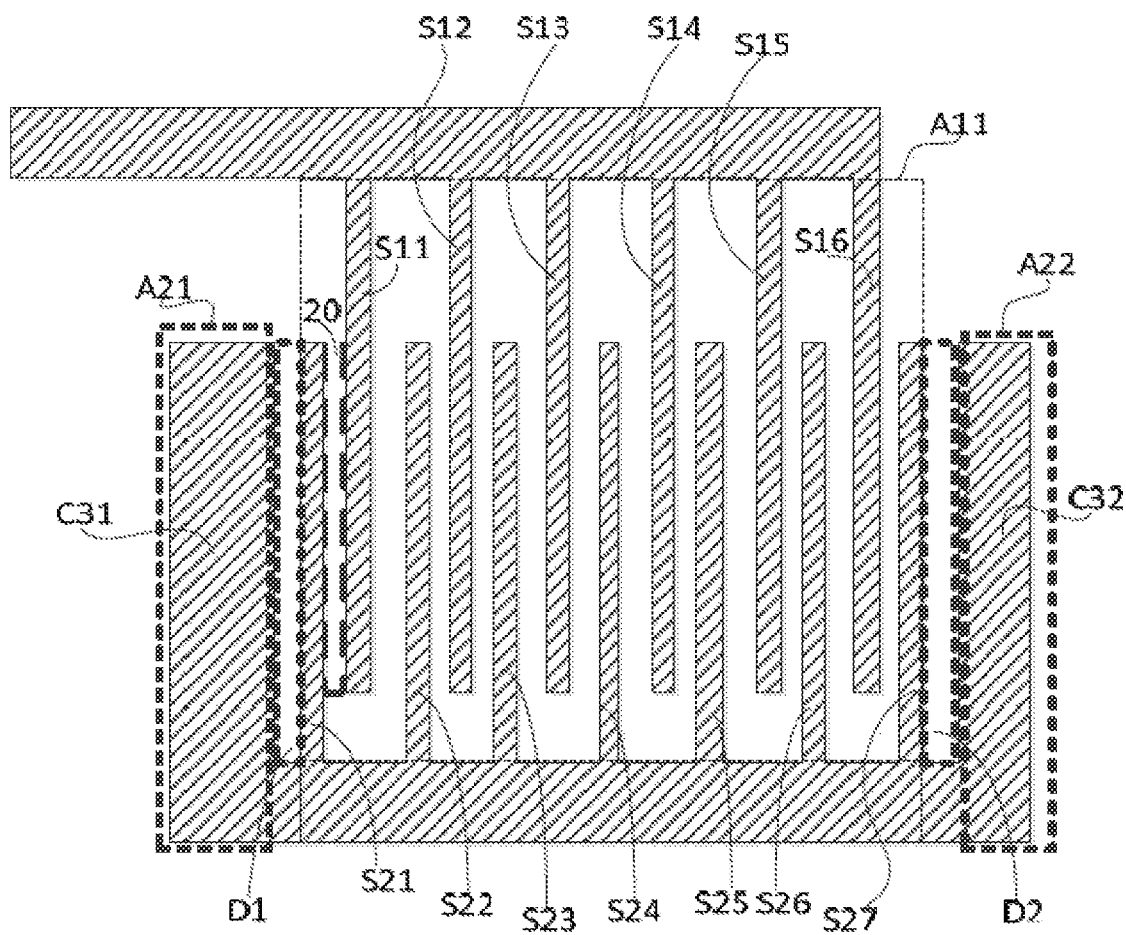
FIG. 3 is a schematic diagram of a structure in which a first electrode plate portion C31 and a second electrode plate portion C32 are added on the basis of FIG. 2.

As shown in FIG. 3, a first transistor region A11 is arranged between the first capacitor region A21 and the second capacitor region A22;

a first plate portion C31 is provided in A21, and a second plate portion C32 is provided in A22;

A11 is provided with a first one of first electrode portions and a first one of second electrode portions in at least one embodiment shown in FIG. 2;

a first dummy channel region D1 is formed between C31 and S21, and a second dummy channel region D2 is formed between C32 and S27, so as to improve the process uniformity of an edge effective channel.

According to another specific embodiment, B may be equal to A−1; a second sub-electrode portion included in the n-th second electrode portion is disposed between two first sub-electrode portions included in the n-th first electrode portion; channel regions are formed between the second sub-electrode portion included in the n-th second electrode portion and the two first sub-electrode portions included in the n-th first electrode portion, respectively.

Figure 4:
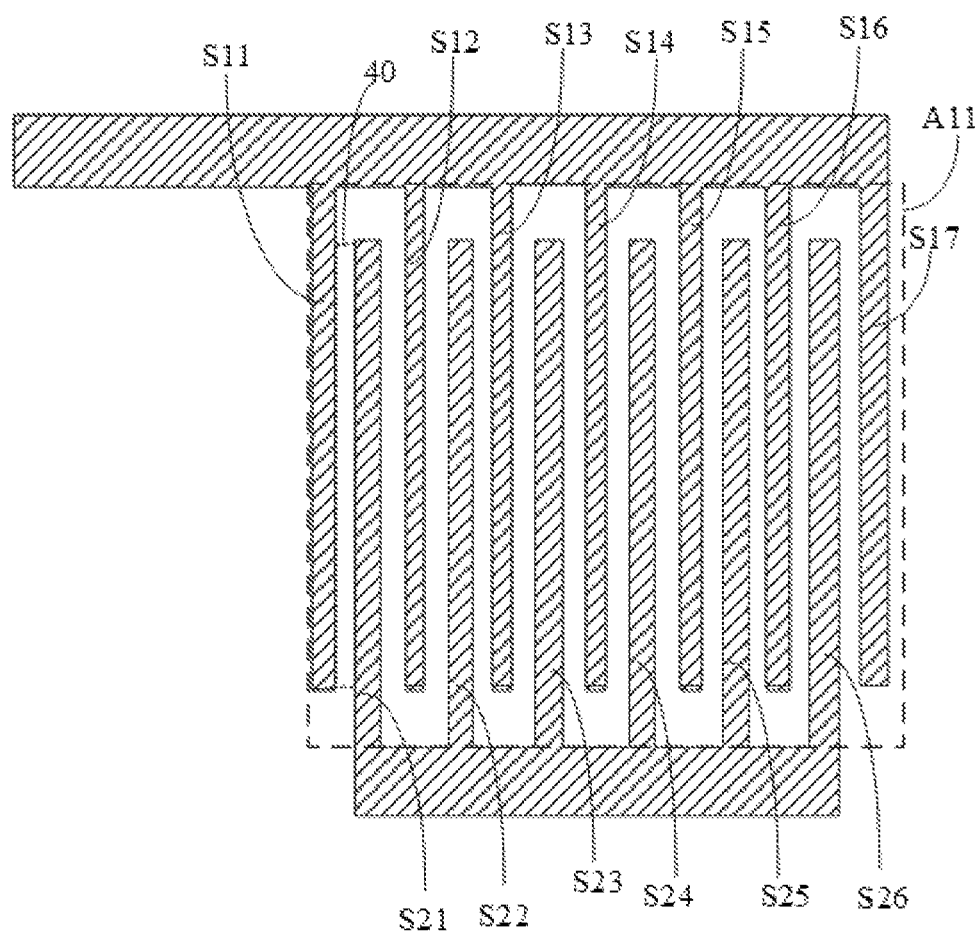
FIG. 4 is a schematic structural diagram of a first one of first electrode portions included in a transistor of a split structure in a shift register unit included in a display panel and a first one of second electrode portions included in the transistor according to at least one embodiment of the present disclosure.

As shown in FIG. 4, the first one of first electrode portions may include seven first sub-electrode portions, and the first one of second electrode portions may include six second sub-electrode portions;

the seven first sub-electrode portions are: a first first sub-electrode portion S11, a second first sub-electrode portion S12, a third first sub-electrode portion S13, a fourth first sub-electrode portion S14, a fifth first sub-electrode portion S15, a sixth first sub-electrode portion S16, and a seventh first sub-electrode portion S17;

the six second sub-electrode portions are: a first second sub-electrode portion S21, a second second sub-electrode portion S22, a third second sub-electrode portion S23, a fourth second sub-electrode portion S24, a fifth second sub-electrode portion S25, and a sixth second sub-electrode portion S26;

S11, S12, S13, S14, S15, S16, S17, S21, S22, S23, S24, S25 and S26 may be arranged in the first transistor region A11;

S11, S12, S13, S14, S15, S16 and S17 are interconnected, and S21, S22, S23, S24, S25 and S26 are interconnected;

S21 is arranged between S11 and S12, S22 is arranged between S12 and S13, S23 is arranged between S13 and S14, S24 is arranged between S14 and S15, S25 is arranged between S15 and S16, and S26 is arranged between S16 and S17.

A channel region is formed between S21 and S11, a channel region is formed between S21 and S12, a channel region is formed between S22 and S12, a channel region is formed between S22 and S13, a channel region is formed between S23 and S13, a channel region is formed between S23 and S14, a channel region is formed between S24 and S14, a channel region is formed between S24 and S15, a channel region is formed between S25 and S15, a channel region is formed between S25 and S16, a channel region is formed between S26 and S16, and a channel region is formed between S26 and S17.

In at least one embodiment shown in FIG. 4, S11, S12, S13, S14, S15, S16, S17, S21, S22, S23, S24, S25, and S26 may be parallel to each other, but not limited thereto.

In at least one embodiment shown in FIG. 4, the adjacent first sub-electrode and second sub-electrode are arranged opposite to each other, and the first electrode portion and the second electrode portion are interdigital electrodes.

As shown in FIG. 4, S21 and S11 are arranged opposite to each other, and a second channel region 40 is formed between S11 and S21.

Optionally, the display panel may include a shift register unit, the shift register unit includes a storage capacitor; the display panel has a plurality of capacitor regions that are spaced apart; the storage capacitor includes a first electrode plate and a second electrode plate. The second electrode plate includes a plurality of electrode plate portions, and each of the plurality of electrode plate portions is located in one of the capacitor regions. An n-th first electrode portion and an n-th second electrode portion are located in an n-th transistor region. At least one capacitor region is adjacent to the n-th transistor region; and one of the second sub-electrode portions in the n-th transistor region is adjacent to an electrode plate portion in a capacitor region adjacent to the n-th transistor region. A dummy channel region is formed between the electrode plate portion in the capacitor region adjacent to the n-th transistor region and the second sub-electrode portion in the n-th transistor region adjacent to the electrode plate portion.

Figure 5:
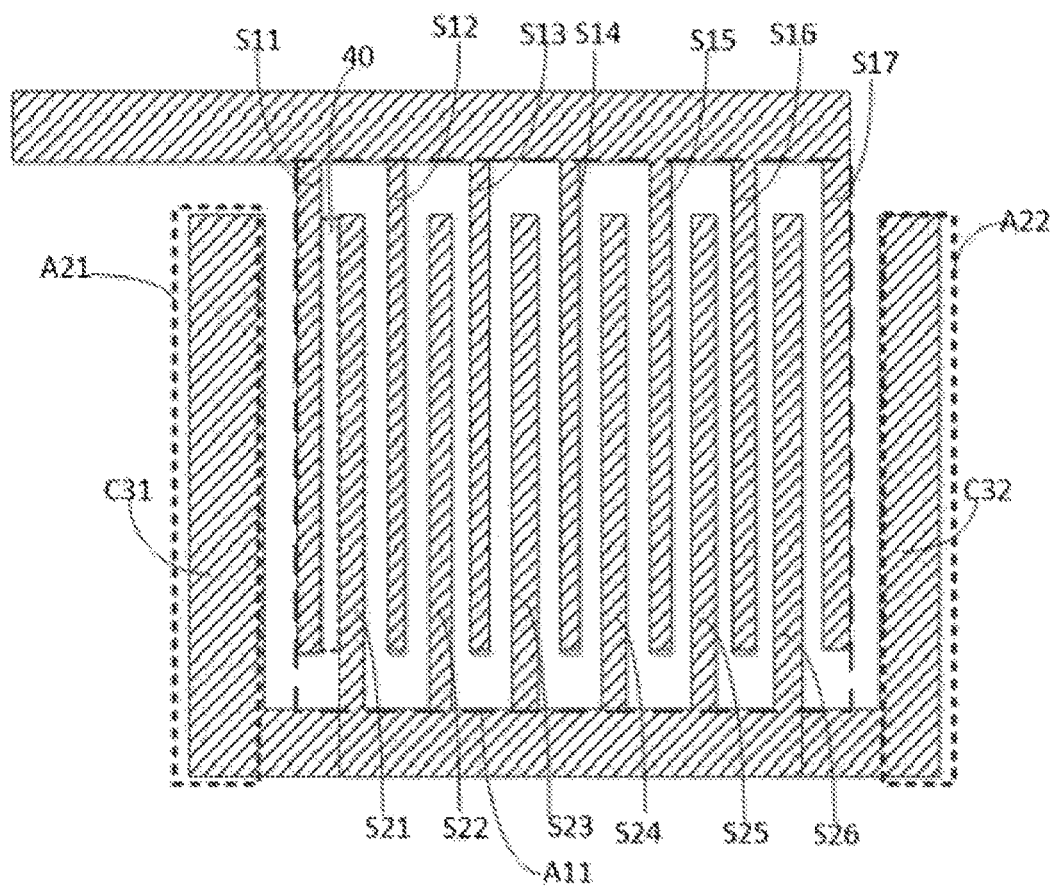
FIG. 5 is a schematic diagram of a structure in which a first electrode plate portion C31 and a second electrode plate portion C32 are added on the basis of FIG. 2.

As shown in FIG. 5, the first transistor region A11 is arranged between the first capacitor region A21 and the second capacitor region A22. The first transistor region A11 is arranged between the first capacitor region A21 and the second capacitor region A22. A first electrode plate portion C31 is provided in A21, and a second electrode plate portion C32 is provided in A22. A11 is provided with the first electrode portion and the first electrode portion according to at least one embodiment shown in FIG. 4. A channel region is formed between C31 and S11, and a channel region is formed between C32 and S17.

Figure 6:
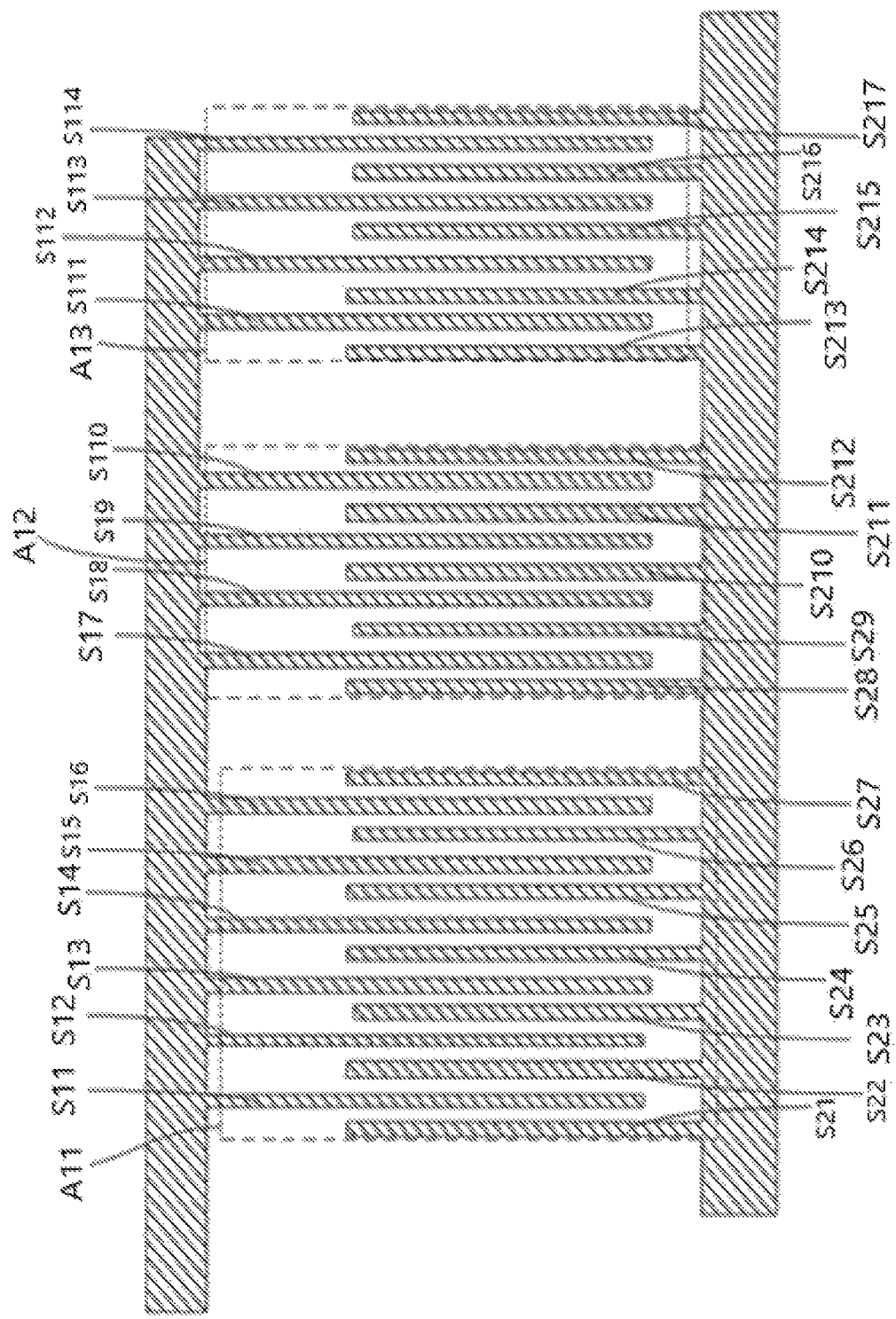
FIG. 6 is a schematic structural diagram of a first one of first electrode portions included in a transistor of a split structure in a shift register unit included in a display panel and a first one of second electrode portions included in the transistor according to at least one embodiment of the present disclosure.

As shown in FIG. 6, a shift register unit in the display panel according to at least one embodiment of the present disclosure may include a transistor of a split structure; a first electrode of the transistor of the split structure and a second electrode of the transistor of the split structure are located on a same layer.

The first electrode of the transistor of the split structure includes a first one of first electrode portions, a second one of first electrode portions, and a third one of first electrode portions; and the second electrode of the transistor of the split structure includes a first one of second electrode portions, a second one of second electrode portions and a third one of second electrode portions.

The first one of first electrode portions, the second one of first electrode portions, and the third one of first electrode portions are electrically coupled to each other; and the first one of second electrode portions, the second one of second electrode portions and the third one of second electrode portions are electrically coupled to each other.

Both the first one of first electrode portions and the first one of second electrode portions are provided in the first transistor region A11, the second one of first electrode portions and the second one of second electrode portions are both provided in the second transistor region A12, and the third one of first electrode portions and the third one of second electrode portions are both arranged in the third transistor region A13.

A11, A12 and A13 are arranged at intervals from left to right.

The first one of first electrode portions includes a first first sub-electrode portion S11, a second first sub-electrode portion S12, a third first sub-electrode portion S13, a fourth first sub-electrode portion S14, a fifth first sub-electrode portion S15 and a sixth first sub-electrode portion S16. The first one of second electrode portions includes a first second sub-electrode portion S21, a second second sub-electrode portion S22, a third second sub-electrode portion S23, a fourth second sub-electrode portion S24, a fifth second sub-electrode portion S25, a sixth second sub-electrode portion S26, and a seventh second sub-electrode portion S27.

S11, S12, S13, S14, S15, S16, S21, S22, S23, S24, S25, S26 and S27 are arranged in the first transistor region A11.

S11, S12, S13, S14, S15, and S16 are electrically coupled to each other, and S21, S22, S23, S24, S25, S26, and S27 are electrically coupled to each other.

S11 is arranged between S21 and S22, S12 is arranged between S22 and S23, S13 is arranged between S23 and S24, S14 is arranged between S24 and S25, S15 is arranged between S25 and S26, and S16 is arranged between S26 and S27.

A channel region is formed between S11 and S21, a channel region is formed between S11 and S22, a channel region is formed between S12 and S22, a channel region is formed between S12 and S23, a channel region is formed between S13 and S23, a channel region is formed between S13 and S24, a channel region is formed between S14 and S24, a channel region is formed between S14 and S25, a channel region is formed between S15 and S25, a channel region is formed between S15 and S26, a channel region is formed between S16 and S26, and a channel region is formed between S16 and S27.

The second one of first electrode portions includes a seventh first sub-electrode portion S17, an eighth first sub-electrode portion S18, a ninth first sub-electrode portion S19, and a tenth first sub-electrode portion S110. The second one of second electrode portions includes an eighth second sub-electrode portion S28, a ninth second sub-electrode portion S29, a tenth second sub-electrode portion S210, an eleventh second sub-electrode portion S211, and a twelfth second sub-electrode portion S212.

S17, S18, S19, S110, S28, S29, S210, S211 and S212 are arranged in the second transistor region A12.

S37, S38, S39 and S310 are electrically coupled to each other, and S48, S49, S410, S411 and S412 are electrically coupled to each other.

S17 is arranged between S28 and S29, S18 is arranged between S29 and S210, S19 is arranged between S210 and S211, and S110 is arranged between S211 and S212.

A channel region is formed between S17 and S28, a channel region is formed between S17 and S29, a channel region is formed between S18 and S29, a channel region is formed between S18 and S210, and a channel region is formed between S19 and S210, a channel region is formed between S19 and S211, a channel region is formed between S110 and S211, and a channel region is formed between S10 and S212.

The third one of first electrode portions includes an eleventh first sub-electrode portion S111, a twelfth first sub-electrode portion S212, a thirteenth first sub-electrode portion S113, and a fourteenth second sub-electrode portion S114. The third one of second electrode portions includes a thirteenth second sub-electrode portion S213, a fourteenth second sub-electrode portion S214, a fifteenth second sub-electrode portion S215, a sixteenth second sub-electrode portion S216, and a seventeenth second sub-electrode portion S217.

S111, S112, S113, S114, S113, S114, S115, S116 and S117 are arranged in the third transistor region A13.

S111, S112, S113 and S114 are electrically coupled to each other, and S213, S214, S215, S216 and S217 are electrically coupled to each other.

S111 is arranged between S213 and S214, S112 is arranged between S214 and S215, S113 is arranged between S215 and S216, and S114 is arranged between S216 and S217.

A channel region is formed between S111 and S213, a channel region is formed between S111 and S214, a channel region is formed between S112 and S214, a channel region is formed between S112 and S215, a channel region is formed between S113 and S215, a channel region is formed between S113 and S216, a channel region is formed between S114 and S216, and a channel region is formed between S114 and S217.

In at least one embodiment shown in FIG. 6, a distance between A11 and A12 is greater than a threshold distance, a distance between A12 and A13 is greater than a threshold distance, and a distance between A13 and A14 is greater than a threshold distance. The threshold distance may be determined according to the sizes of a TFT and a frame of the display panel. Optionally, the threshold distance may be greater than or equal to 10 µm (micrometers).

In at least one embodiment shown in FIG. 6, in a case that the transistor of a split structure is an output transistor, every first sub-electrode portions may be electrically connected to the clock signal line, and every second sub-electrode portions may be electrically connected to the gate drive signal output terminal.

In at least one embodiment shown in FIG. 6, in a case that the transistor of a split structure is an output pull-down transistor, various first sub-electrode portions may be electrically connected to the gate drive signal output terminal, and various second sub-electrode portions may be electrically connected to the first voltage terminal.

In at least one embodiment shown in FIG. 6, in a case that the transistor of a split structure is an input transistor, various first sub-electrode portions may be electrically connected to the input terminal, and various second sub-electrode portions may be connected to the pull-up node.

Figure 7:
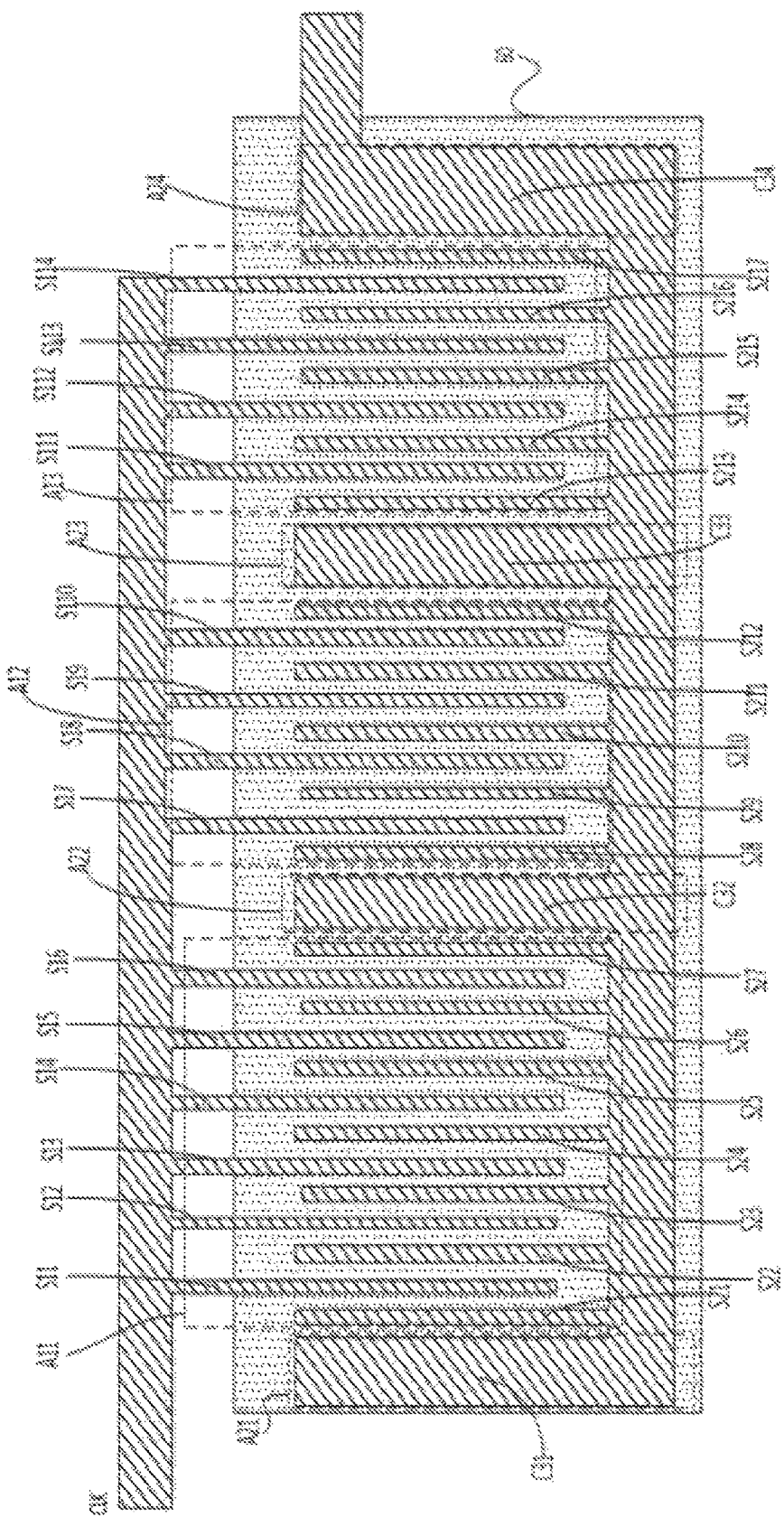
FIG. 7 is a schematic structural diagram of a first electrode of an output transistor, a second electrode of the output transistor, a second electrode plate of a storage capacitor, and a gate electrode of the output transistor of a shift register unit included in a display panel according to at least one embodiment of the present disclosure.

As shown in FIG. 7, a shift register unit in a display panel according to at least one embodiment of the present disclosure may include a clock signal line CLK, an output transistor, and a storage capacitor. A gate electrode 60 of the output transistor and a first electrode plate of the storage capacitor are an integral structure, a first electrode of the output transistor is electrically connected to the clock signal line CLK, and a second electrode of the output transistor is electrically connected to a second electrode plate of the storage capacitor.

The first electrode of the output transistor, the second electrode of the output transistor and the second electrode plate of the storage capacitor are located on a same layer.

The first electrode of the output transistor includes a first one of first electrode portions, a second one of first electrode portions, and a third one of first electrode portions.

The second electrode of the output transistor includes a first one of second electrode portions, a second one of second electrode portions and a third one of second electrode portions.

The second electrode plate of the storage capacitor includes a first electrode plate portion C31, a second electrode plate portion C32, a third electrode plate portion C33, and a fourth electrode plate portion C34; and C31, C32, C33, and C34 are electrically coupled to each other.

C31 is arranged in the first capacitor region A21, C32 is arranged in the second capacitor region A22, C33 is arranged in the third capacitor region A23, and C34 is arranged in the fourth capacitor region A24.

The first capacitor region A21, the first transistor region A11, the second capacitor region A22, the second transistor region A12, the third capacitor region A23, the third transistor region A13 and the fourth capacitor region A24 are arranged at intervals from the left to the right.

The first one of first electrode portions includes a first first sub-electrode portion S11, a second first sub-electrode portion S12, a third first sub-electrode portion S13, a fourth first sub-electrode portion S14, a fifth first sub-electrode portion S15 and a sixth first sub-electrode portion S16. The first one of second electrode portions includes a first second sub-electrode portion S21, a second second sub-electrode portion S22, a third second sub-electrode portion S23, a fourth second sub-electrode portion S24, a fifth second sub-electrode portion S25, a sixth second sub-electrode portion S26, and a seventh second sub-electrode portion S27.

S11, S12, S13, S14, S15, S16, S21, S22, S23, S24, S25, S26 and S27 are arranged in the first transistor region A11.

S11, S12, S13, S14, S15 and S16 are all electrically connected to the clock signal line CLK, S21, S22, S23, S24, S25, S26 and S27 are all electrically connected to C31.

S11 is arranged between S21 and S22, S12 is arranged between S22 and S23, S13 is arranged between S23 and S24, S14 is arranged between S24 and S25, S15 is arranged between S25 and S26, and S16 is arranged between S26 and S27.

A channel region is formed between S11 and S21, and a channel region is formed between S11 and S22. A channel region is formed between S12 and S22, and a channel region is formed between S12 and S23. A channel region is formed between S13 and S23, and a channel region is formed between S13 and S24. A channel region is formed between S14 and S24, and a channel region is formed between S14 and S25. A channel region is formed between S15 and S25, and a channel region is formed between S15 and S26. A channel region is formed between S16 and S26, and a channel region is formed between S16 and S27.

A first dummy channel region is formed between C31 and S21, and a second dummy channel region is formed between C32 and S27.

The second one of first electrode portions includes a seventh first sub-electrode portion S17, an eighth first sub-electrode portion S18, a ninth first sub-electrode portion S19, and a tenth first sub-electrode portion S110. The second one of second electrode portions includes an eighth second sub-electrode portion S28, a ninth second sub-electrode portion S29, a tenth second sub-electrode portion S210, an eleventh second sub-electrode portion S211, and a twelfth second sub-electrode portion S212.

S17, S18, S19, S110, S28, S29, S210, S211 and S212 are arranged in the second transistor region A12.

S17, S18, S19 and S110 are all electrically connected to the clock signal line CLK, and S28, S29, S210, S211 and S212 are all electrically connected to C32.

S17 is arranged between S28 and S29, S18 is arranged between S29 and S210, S19 is arranged between S210 and S211, and S110 is arranged between S211 and S212.

A channel region is formed between S17 and S28, a channel region is formed between S17 and S29, a channel region is formed between S18 and S29, a channel region is formed between S18 and S210, a channel region is formed between S19 and S210, a channel region is formed between S19 and S211, a channel region is formed between S110 and S211, and a channel region is formed between S110 and S212.

A third dummy channel region is formed between C32 and S28, and a fourth dummy channel region is formed between C33 and S212.

The third one of first electrode portions includes an eleventh first sub-electrode portion S111, a twelfth first sub-electrode portion S112, a thirteenth first sub-electrode portion S113, and a fourteenth first sub-electrode portion S114. The third one of second electrode portions includes a thirteenth second sub-electrode portion S213, a fourteenth second sub-electrode portion S214, a fifteenth second sub-electrode portion S215, a sixteenth second sub-electrode portion S216, and a seventeenth second sub-electrode portion S217.

S111, S112, S113, S114, S213, S214, S215, S216 and S217 are arranged in the third transistor region A13.

S111, S112, S113 and S114 are all electrically connected to the clock signal line CLK, and S213, S214, S215, S216 and S217 are all electrically connected to C33.

S111 is arranged between S213 and S214, S112 is arranged between S214 and S215, S113 is arranged between S215 and S216, and S114 is arranged between S216 and S217.

A channel region is formed between S111 and S213, a channel region is formed between S111 and S214, a channel region is formed between S112 and S214, a channel region is formed between S112 and S215, a channel region is formed between S113 and S215, a channel region is formed between S113 and S216, a channel region is formed between S114 and S216, and a channel region is formed between S114 and S217.

A fifth dummy channel region is formed between C33 and S213, and a sixth dummy channel region is formed between C34 and S217.

In at least one embodiment shown in FIG. 7, since the second electrode of the output transistor (that is, a drain electrode of the output transistor) itself is shorted to the second electrode plate of the storage capacitor, even if the second sub-electrode portion included by the second electrode of the output transistor is electrically connected to the second electrode plate of the storage capacitor through the dummy channel region, which still does not affect the operation of the shift register unit.

In at least one embodiment shown in FIG. 7, the gate metal layer includes the gate electrode 60 of the output transistor, and the source-drain metal layer includes a source electrode of the output transistor, a drain electrode of the output transistor, and the second electrode plate of the storage capacitor. The gate metal layer and the source-drain metal layer may be arranged on the base substrate in sequence, an orthographic projection of A21 onto the base substrate, an orthographic projection of A11 onto the base substrate, an orthographic projection of A22 onto the base substrate, an orthographic projection of A12 onto the base substrate, an orthographic projection of A23 onto the base substrate, an orthographic projection of A13 onto the base substrate, and an orthographic projection of A24 onto the base substrate may be within an orthographic projection of the output transistor 60 onto the base substrate, but not limited to thereto.

Figure 8:
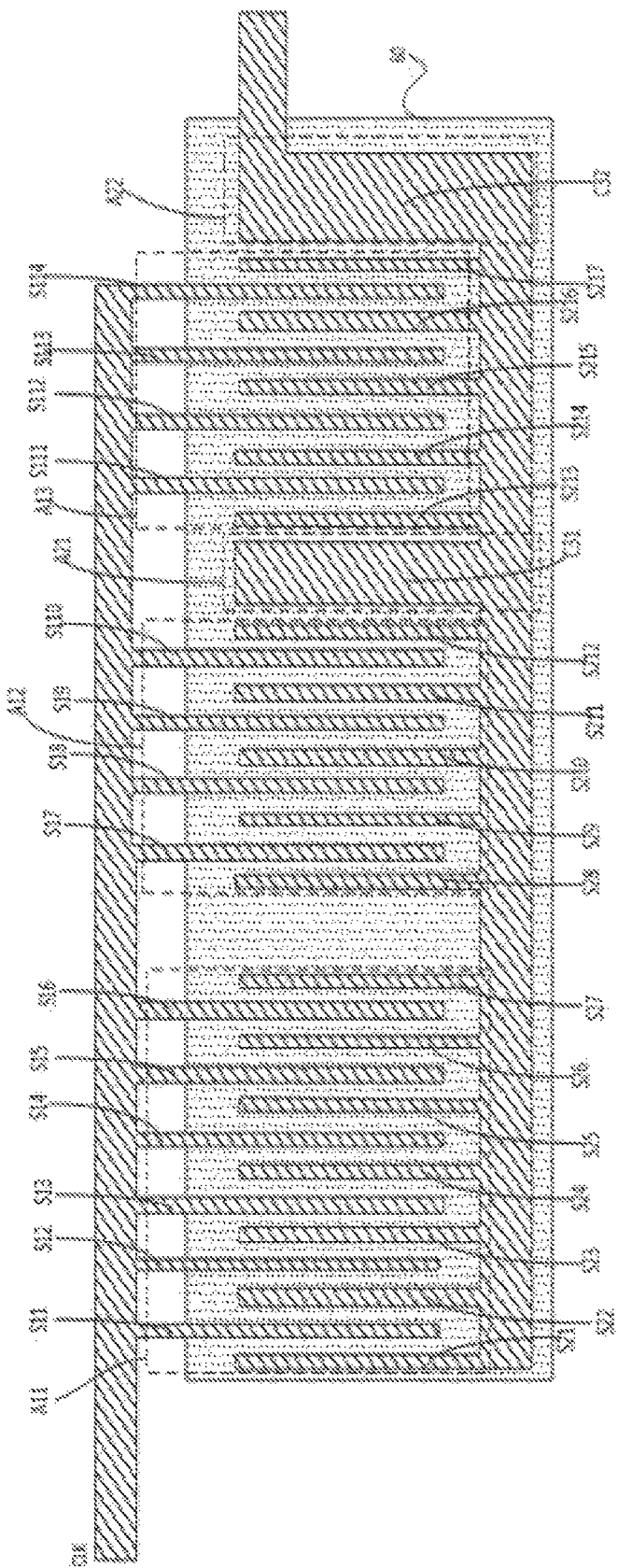
FIG. 8 is a schematic structural diagram of a first electrode of an output transistor, a second electrode of the output transistor, a second electrode plate of a storage capacitor, and a gate electrode of the output transistor of a shift register unit included in a display panel according to at least one embodiment of the present disclosure.

As shown in FIG. 8, a shift register unit in a display panel according to at least one embodiment of the present disclosure may include a clock signal line CLK, an output transistor, and a storage capacitor. A gate electrode 60 of the output transistor and a first electrode plate of the storage capacitor are an integral structure, a first electrode of the output transistor is electrically connected to the clock signal line CLK, and a second electrode of the output transistor is electrically connected to a second electrode plate of the storage capacitor.

The first electrode of the output transistor, the second electrode of the output transistor and the second electrode plate of the storage capacitor are located on a same layer.

The first electrode of the output transistor includes a first one of first electrode portions, a second one of first electrode portions, and a third one of first electrode portions.

The second electrode of the output transistor includes a first one of second electrode portions, a second one of second electrode portions and a third one of second electrode portions.

The second electrode plate of the storage capacitor includes a first electrode plate portion C31 and a second electrode plate portion C32. C31 and C32 are electrically coupled to each other.

C31 is arranged in the first capacitor region A21, and C32 is arranged in the second capacitor region A22.

The first transistor region A11, the second transistor region A12, the first capacitor region A21, the third transistor region A13, and the second capacitor region A22 are arranged at intervals from left to right.

The first one of first electrode portions includes a first first sub-electrode portion S11, a second first sub-electrode portion S12, a third first sub-electrode portion S13, a fourth first sub-electrode portion S14, a fifth first sub-electrode portion S15, and a sixth first sub-electrode portion S16. The first one of second electrode portions includes a first second sub-electrode portion S21, a second second sub-electrode portion S22, a third second sub-electrode portion S23, a fourth second sub-electrode portion S24, a fifth second sub-electrode portion S25, a sixth second sub-electrode portion S26, and a seventh second sub-electrode portion S27.

S11, S12, S13, S14, S15, S16, S21, S22, S23, S24, S25, S26 and S27 are arranged in the first transistor region A11.

S11, S12, S13, S14, S15 and S16 are all electrically connected to the clock signal line CLK, S21, S22, S23, S24, S25, S26 and S27 are all electrically connected to C31.

S11 is arranged between S21 and S22, S12 is arranged between S22 and S23, S13 is arranged between S23 and S24, S14 is arranged between S24 and S25, S15 is arranged between S25 and S26, and S16 is arranged between S26 and S27.

A channel region is formed between S11 and S21, and a channel region is formed between S11 and S22. A channel region is formed between S12 and S22, and a channel region is formed between S12 and S23. A channel region is formed between S13 and S23, and a channel region is formed between S13 and S24. A channel region is formed between S14 and S24, and a channel region is formed between S14 and S25. A channel region is formed between S15 and S25, and a channel region is formed between S15 and S26. A channel region is formed between S16 and S26, and a channel region is formed between S16 and S27.

The second one of first electrode portions includes a seventh first sub-electrode portion S17, an eighth first sub-electrode portion S18, a ninth first sub-electrode portion S19, and a tenth first sub-electrode portion S110. The second one of second electrode portions includes an eighth second sub-electrode portion S28, a ninth second sub-electrode portion S29, a tenth second sub-electrode portion S210, an eleventh second sub-electrode portion S211, and a twelfth second sub-electrode portion S212.

S17, S18, S19, S110, S28, S29, S210, S211 and S212 are arranged in the second transistor region A12.

S17, S18, S19 and S110 are all electrically connected to the clock signal line CLK, and S28, S29, S210, S211 and S212 are all electrically connected to C32.

S17 is arranged between S28 and S29, S18 is arranged between S29 and S210, S19 is arranged between S210 and S211, and S110 is arranged between S211 and S212.

A channel region is formed between S17 and S28, a channel region is formed between S17 and S29, a channel region is formed between S18 and S29, a channel region is formed between S18 and S210, a channel region is formed between S19 and S210, a channel region is formed between S19 and S211, a channel region is formed between S110 and S211, and a channel region is formed between S110 and S212.

The third one of first electrode portions includes an eleventh first sub-electrode portion S111, a twelfth first sub-electrode portion S112, a thirteenth first sub-electrode portion S113, and a fourteenth first sub-electrode portion S114. The third one of second electrode portions includes a thirteenth second sub-electrode portion S213, a fourteenth second sub-electrode portion S214, a fifteenth second sub-electrode portion S215, a sixteenth second sub-electrode portion S216, and a seventeenth second sub-electrode portion S217.

S111, S112, S113, S114, S213, S214, S215, S216 and S217 are arranged in the third transistor region A13.

S111, S112, S113 and S114 are all electrically connected to the clock signal line CLK, and S213, S214, S215, S216 and S217 are all electrically connected to C33.

S111 is arranged between S213 and S214, S112 is arranged between S214 and S215, S113 is arranged between S215 and S216, and S114 is arranged between S216 and S217.

A channel region is formed between S111 and S213, a channel region is formed between S111 and S214, a channel region is formed between S112 and S214, a channel region is formed between S112 and S215, a channel region is formed between S113 and S215, a channel region is formed between S113 and S216, a channel region is formed between S114 and S216, and a channel region is formed between S114 and S217.

A first dummy channel region is formed between C31 and S212, a second dummy channel region is formed between C31 and S213, and a third dummy channel is formed between C32 and S217.

In at least one embodiment shown in FIG. 8, since the second electrode of the output transistor (that is, a drain electrode of the output transistor) itself is shorted to the second electrode plate of the storage capacitor, even if the second sub-electrode portion included by the second electrode of the output transistor is electrically connected to the second electrode plate of the storage capacitor through the dummy channel region, which still does not affect the operation of the shift register unit.

In at least one embodiment of the present disclosure, the second electrode plate of the storage capacitor may include a plurality of electrode plate portions, and the plurality of electrode plate portions are respectively arranged in a capacitor region. The capacitor region and the transistor region are alternately arranged. The transistors of the split structure are located in the transistor region.

Figure 9:
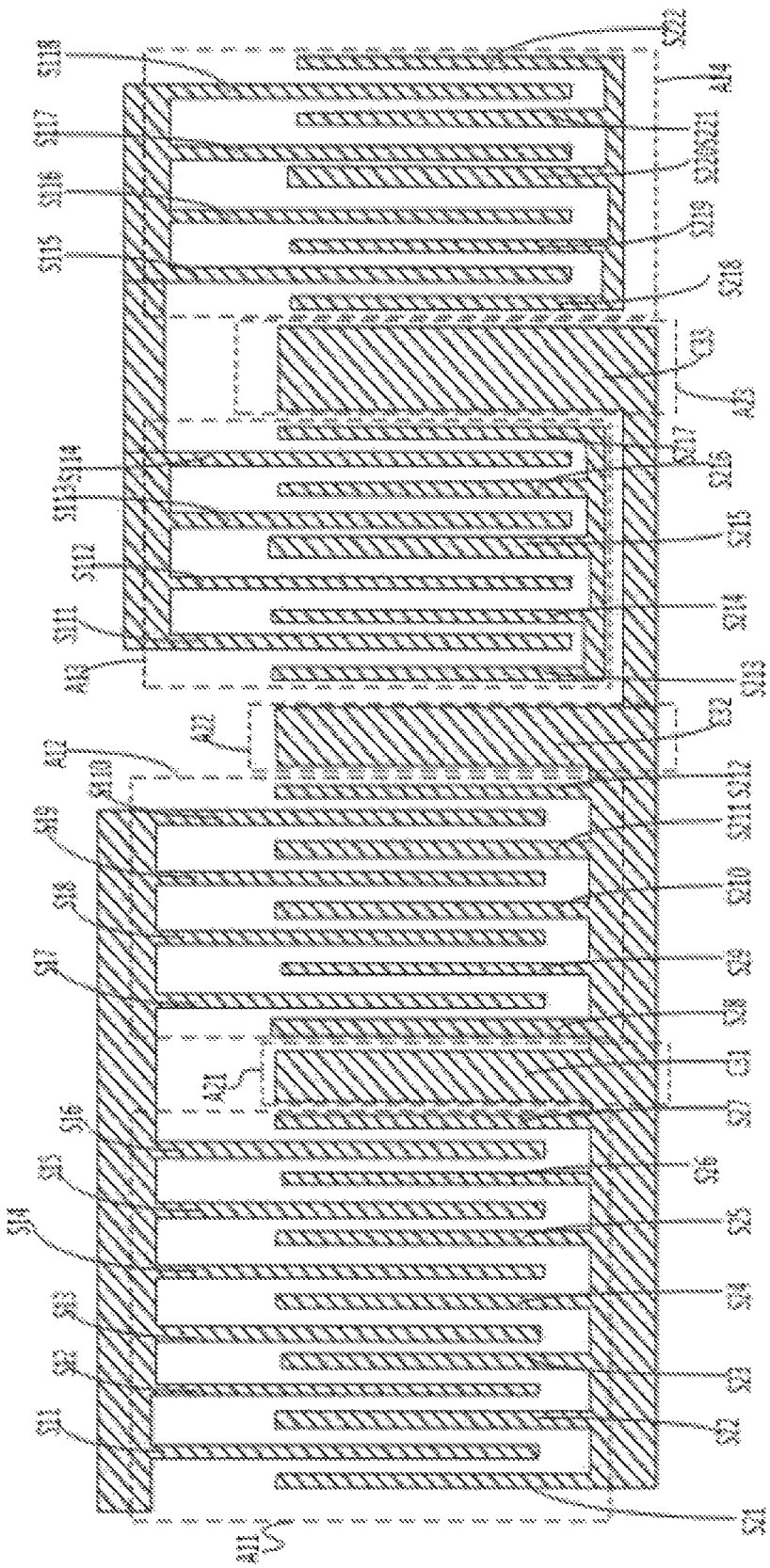
FIG. 9 is a schematic structural diagram of a first electrode of a first transistor, a second electrode of the first transistor, a first electrode of a second transistor, a second electrode of the second transistor, and a second electrode plate of a storage capacitor of a shift register unit included in a display panel according to at least one embodiment of the present disclosure.

As shown in FIG. 9, a shift register unit in a display panel according to at least one embodiment of the present disclosure may include a first transistor, a second transistor, and a storage capacitor.

Both the first transistor and the second transistor are transistors of a split structure. The first transistor is an output transistor.

A first electrode of the first transistor, a second electrode of the first transistor, a first electrode of the second transistor, a second electrode of the second transistor, and a second electrode plate of the storage capacitor are located in a same layer.

The first electrode of the first transistor includes a first one of first electrode portions and a second one of first electrode portions.

The second electrode of the first transistor includes a first one of second electrode portions and a second one of second electrode portions.

The first electrode of the second transistor includes a third one of first electrode portions and a fourth one of first electrode portions.

The second electrode of the second transistor includes a third one of second electrode portions and a fourth one of second electrode portions.

The second electrode plate of the storage capacitor includes a first electrode plate portion C31, a second electrode plate portion C32 and a third electrode plate portion C33; C31, C32 and C33 are electrically coupled to each other.

C31 is arranged in the first capacitor region A21, C32 is arranged in the second capacitor region A22, and C33 is arranged in the third capacitor region A23.

The first transistor region A11, the first capacitor region A21, the second transistor region A12, the second capacitor region A22, the third transistor region A13, the third capacitor region A23 and the fourth transistor region A14 are arranged at intervals from the left to the right.

The first one of first electrode portions includes a first first sub-electrode portion S11, a second first sub-electrode portion S12, a third first sub-electrode portion S13, a fourth first sub-electrode portion S14, a fifth first sub-electrode portion S15 and a sixth first sub-electrode portion S16. The first one of second electrode portions includes a first second sub-electrode portion S21, a second second sub-electrode portion S22, a third second sub-electrode portion S23, a fourth second sub-electrode portion S24, a fifth second sub-electrode portion S25, a sixth second sub-electrode portion S26, and a seventh second sub-electrode portion S27.

S11, S12, S13, S14, S15, S16, S21, S22, S23, S24, S25, S26 and S27 are arranged in the first transistor region A11.

S11, S12, S13, S14, S15, and S16 are electrically coupled to each other, and S21, S22, S23, S24, S25, S26, and S27 are electrically coupled to each other. C31 and S21 are electrically coupled.

S11 is arranged between S21 and S22, S12 is arranged between S22 and S23, S13 is arranged between S23 and S24, S14 is arranged between S24 and S25, S15 is arranged between S25 and S26, and S16 is arranged between S26 and S27.

A channel region is formed between S11 and S21, a channel region is formed between S11 and S22, a channel region is formed between S12 and S22, a channel region is formed between S12 and S23, a channel region is formed between S13 and S23, a channel region is formed between S13 and S24, a channel region is formed between S14 and S24, a channel region is formed between S14 and S25, a channel region is formed between S15 and S25, a channel region is formed between S15 and S26, a channel region is formed between S16 and S26, and a channel region is formed between S16 and S27.

A first dummy channel region is formed between C31 and S27.

The second one of first electrode portions includes a seventh first sub-electrode portion S17, an eighth first sub-electrode portion S18, a ninth first sub-electrode portion S19, and a tenth first sub-electrode portion S110. The second one of second electrode portions includes an eighth second sub-electrode portion S28, a ninth second sub-electrode portion S29, a tenth second sub-electrode portion S210, an eleventh second sub-electrode portion S211, and a twelfth second sub-electrode portion S212.

S17, S18, S19, S110, S28, S29, S210, S211 and S212 are arranged in the second transistor region A12.

S37, S38, S39 and S310 are electrically coupled to each other, and S48, S49, S410, S411 and S412 are electrically coupled to each other.

S17 is arranged between S28 and S29, S18 is arranged between S29 and S210, S19 is arranged between S210 and S211, and S110 is arranged between S211 and S212.

A channel region is formed between S17 and S28, a channel region is formed between S17 and S29, a channel region is formed between S18 and S29, a channel region is formed between S18 and S210, and a channel region is formed between S19 and S210, a channel region is formed between S19 and S211, a channel region is formed between S110 and S211, and a channel region is formed between S10 and S212.

A second dummy channel region is formed between C31 and S28, and a third dummy channel region is formed between C32 and S212.

The third one of first electrode portions includes an eleventh first sub-electrode portion S111, a twelfth first sub-electrode portion S212, a thirteenth first sub-electrode portion S113, and a fourteenth second sub-electrode portion S114. The third one of second electrode portions includes a thirteenth second sub-electrode portion S213, a fourteenth second sub-electrode portion S214, a fifteenth second sub-electrode portion S215, a sixteenth second sub-electrode portion S216, and a seventeenth second sub-electrode portion S217.

S111, S112, S113, S114, S113, S114, S115, S116 and S117 are arranged in the third transistor region A13.

S111, S112, S113 and S114 are electrically coupled to each other, and S213, S214, S215, S216 and S217 are electrically coupled to each other.

S111 is arranged between S213 and S214, S112 is arranged between S214 and S215, S113 is arranged between S215 and S216, and S114 is arranged between S216 and S217.

A channel region is formed between S111 and S213, a channel region is formed between S111 and S214, a channel region is formed between S112 and S214, a channel region is formed between S112 and S215, a channel region is formed between S113 and S215, a channel region is formed between S113 and S216, a channel region is formed between S114 and S216, and a channel region is formed between S114 and S217.

A fourth dummy channel region is formed between C32 and S213, and a fifth dummy channel region is formed between C33 and S217. The fourth one of first electrode portions includes a fifteenth first sub-electrode portion S115, a sixteenth first sub-electrode portion S116, a seventeenth first sub-electrode portion S117, and an eighteenth first sub-electrode portion S118. The fourth one of second electrode portions includes an eighteenth second sub-electrode portion S218, a nineteenth second sub-electrode portion S219, a twentieth second sub-electrode portion S220, a twenty-first second sub-electrode portion S221, and a twenty-second second sub-electrode portion S222.

S115, S116, S117, S118, S218, S219, S220, S221 and S222 are arranged in the fourth transistor region A14.

S115, S116, S117 and S118 are electrically coupled, S218, S219, S220, S221, and S222 are electrically coupled. S114 and S115 are electrically coupled, and S217 and S218 are electrically coupled.

S115 is arranged between S218 and S219, S116 is arranged between S219 and S220, S117 is arranged between S220 and S221, and S118 is arranged between S221 and S222.

A channel region is formed between S115 and S218, a channel region is formed between S115 and S219, a channel region is formed between S116 and S219, a channel region is formed between S116 and S220, a channel region is formed between S117 and S220, a channel region is formed between S117 and S221, a channel region is formed between S118 and S221, and a channel region is formed between S118 and S222.

A sixth dummy channel region is formed between C33 and S218. In at least one embodiment shown in FIG. 9, three electrode plate portions included in the second electrode plate of the storage capacitor are respectively arranged in the corresponding capacitor regions. The capacitor region and the transistor region where different transistors of a split structure are located are arranged alternately.

The above embodiments are embodiments of the present disclosure. It should be noted that for those of ordinary skill in the art, without departing from the principle of the present disclosure, several improvements and modifications can be made, and these improvements and modifications shall also be within the protection scope of the present disclosure.

What is claimed is:

1. A display panel comprising: at least one transistor of a split structure, wherein each of the at least one transistor of the split structure comprises a control electrode, a first electrode and a second electrode;
the first electrode comprises N first electrode portions, the second electrode comprises N second electrode portions, and N is an integer greater than 2;
the N first electrode portions are electrically coupled, and the N second electrode portions are electrically coupled;
wherein the display panel has a plurality of transistor regions arranged at intervals, one of the at least one transistor of the split structure occupies at least two transistor regions comprising a first transistor region and a second transistor region adjacent to each other, and for the one transistor of the split structure:
an n-th first electrode portion and an n-th second electrode portion are both located in the first transistor region, an m-th first electrode portion and an (m+1)-th first electrode portion are respectively located in the first transistor region and the second transistor region, each of n and m is a positive integer, n is less than or equal to N, and m is less than or equal to N−1;
the n-th first electrode portion comprises A first sub-electrode portions, and the n-th second electrode portion comprises B second sub-electrode portions; A-B is equal to 1 or −1; A and B are both positive integers; and
the first sub-electrode portions and the second sub-electrode portions are alternately arranged, and a channel region is formed between each of the first sub-electrode portions and one of the second sub-electrode portions that are adjacent;
in the first transistor region, a distance between each of the first sub-electrode portions and the one of the second sub-electrode portions in a horizontal direction is a width of the channel region;
a second distance between the first transistor region and the second transistor region in the horizontal direction is greater than K times the width of the channel region, wherein K is greater than or equal to 2, and is less than or equal to 3, and K is a positive number; and
there is no first sub-electrode portion and no second sub-electrode portion arranged between the first transistor region and the second transistor region.

2. The display panel according to claim 1, further comprising a gate driving circuit, wherein the gate driving circuit comprises a plurality of cascaded shift register units; and
at least one transistor comprised in the plurality of shift register units is the transistor of the split structure.

3. The display panel according to claim 2, wherein each of the plurality of shift register units comprises a gate drive signal output terminal, an input terminal and a clock signal line; and
the first electrode of each of the at least one transistor of the split structure or the second electrode of each of the at least one transistor of the split structure is electrically coupled with the gate drive signal output terminal, the input terminal or the clock signal line.

4. The display panel according to claim 3, wherein a storage capacitor in each of the plurality of shift register units comprises a first electrode plate and a second electrode plate, and the second electrode plate comprises at least one electrode plate portion; and
the at least one electrode plate portion is adjacent to at least one of the plurality of transistor regions.

5. The display panel according to claim 4, wherein the display panel has a plurality of capacitor regions arranged at intervals, the second electrode plate comprises a plurality of electrode plate portions, and each of the plurality of electrode plate portions is located in one of the plurality of capacitor regions.

6. The display panel according to claim 5, wherein at least one of the plurality of transistor regions is located between adjacent capacitor regions; or, at least one of the plurality of capacitor regions is located between adjacent transistor regions.

7. The display panel according to claim 5, wherein transistor regions where a first electrode comprised in one transistor of the split structure is located and capacitor regions are alternately arranged.

8. The display panel according to claim 7, wherein each of the plurality of shift register units comprises an output transistor,
the one transistor of the split structure is the output transistor, and a second electrode of the output transistor is electrically coupled with the gate drive signal output terminal; and
the first electrode plate and a gate electrode of the output transistor are arranged in a same layer; the second electrode plate and a first electrode of the output transistor are arranged in a same layer.

9. The display panel according to claim 2, wherein each of the plurality of shift register units comprises an output transistor, an output pull-down transistor, an input transistor, an input reset transistor, and a storage capacitor;
a control electrode of the output transistor is electrically coupled with a pull-up node, a first electrode of the output transistor is electrically coupled with a clock signal line, and a second electrode of the output transistor is electrically coupled with a gate drive signal output terminal;
a control electrode of the output pull-down transistor is electrically coupled with a reset terminal, a first electrode of the output pull-down transistor is electrically coupled with the gate drive signal output terminal, and a second electrode of the output pull-down transistor is electrically coupled with a first voltage terminal;
a control electrode of the input transistor and a first electrode of the input transistor are electrically coupled with an input terminal, and a second electrode of the input transistor is electrically coupled with the pull-up node;
a control electrode of the input reset transistor is electrically coupled with the reset terminal, a first electrode of the input reset transistor is electrically coupled with the pull-up node, and a second electrode of the input reset transistor is electrically coupled with the first voltage terminal;
a first electrode plate of the storage capacitor is electrically coupled with the control electrode of the output transistor, and a second electrode plate of the storage capacitor is electrically coupled with the second electrode of the output transistor; and at least one of the output transistor, the output pull-down transistor, the input transistor, or the input reset transistor is the transistor of the split structure.

10. The display panel according to claim 1, wherein an absolute value of a difference between lengths of any two of the plurality of transistor regions is less than a predetermined length difference; and the predetermined length difference is 1/d of a minimum of lengths of the plurality of transistor regions, d is a positive number, and d is greater than 5.

11. The display panel according to claim 1, wherein the n-th first electrode portion is an interdigital electrode, and the n-th second electrode portion is an interdigital electrode;
the n-th first electrode portion comprises A comb-shaped first sub-electrode portions, and the n-th second electrode portion comprises B comb-shaped second sub-electrode portions; A-B is equal to 1 or −1; A and B are both positive integers; and
the first sub-electrode portions and the second sub-electrode portions are alternately arranged, and a channel region is formed between each of the first sub-electrode portions and one of the second sub-electrode portions that are adjacent.

12. The display panel according to claim 1, wherein B is equal to A+1;
each of the first sub-electrode portions comprised in the n-th first electrode portion is arranged between two second sub-electrode portions comprised in the n-th second electrode portion; and
channel regions are formed between each of the first sub-electrode portions comprised in the n-th first electrode portion and the two second sub-electrode portions comprised in the n-th second electrode portion, respectively.

13. The display panel according to claim 12, wherein the display panel comprises a shift register unit, and the shift register unit comprises a storage capacitor;
the display panel has a plurality of capacitor regions arranged at intervals; the storage capacitor comprises a first electrode plate and a second electrode plate, the second electrode plate comprises a plurality of electrode plate portions, and each of the plurality of electrode plate portions is located in one of the plurality of capacitor regions;
the n-th first electrode portion and the n-th second electrode portion are both arranged in an n-th transistor region;
at least one of the plurality of capacitor regions is adjacent to the n-th transistor region; a second sub-electrode of the second sub-electrodes in the n-th transistor region is adjacent to an electrode plate portion in a capacitor region adjacent to the n-th transistor region; and
a dummy channel region is formed between the electrode plate portion in the capacitor region adjacent to the n-th transistor region and the second sub-electrode portion in the n-th transistor region adjacent to the electrode plate portion.

14. The display panel according to claim 1, wherein the second distance is greater than 10 microns, the width of the channel region is greater than or equal to 3.33 microns and less than or equal to 5 microns, and a total channel length of the one transistor of the split structure in the horizontal direction is greater than 1000 microns.

15. A display panel comprising: a transistor having a channel length greater than 1000 microns in a first direction, wherein the transistor comprises a control electrode, a first electrode and a second electrode;

the first electrode comprises a plurality of first electrode portions electrically coupled to each other, the second electrode comprises a plurality of second electrode portions electrically coupled to each other, the plurality of second electrode portions is in one to one correspondence with the plurality of first electrode portions;
each first electrode portion comprises a plurality of first sub-electrode portions, and a corresponding second electrode portion comprises a plurality of second sub-electrode portions, each first sub-electrode portion is arranged between corresponding two second sub-electrode portions that are adjacent to each other;
a plurality of channel regions is formed between each first sub-electrode portions and each of the corresponding two second sub-electrode portions, a width of each of the plurality of channel regions in the first direction is greater than or equal to 3.33 microns and less than or equal to 5 microns;
the display panel has a plurality of transistor regions arranged in the first direction, the transistor occupies at least a first transistor region and a second transistor region that are adjacent to each other and are included in the plurality of transistor regions;
the first transistor region and the second transistor region are spaced apart by a distance greater than 10 microns in the first direction, to form a gap between the first transistor region and the second transistor region; and
there is no first sub-electrode portion and no second sub-electrode portion arranged in the gap.

16. The display panel according to claim 15, further comprising a gate driving circuit, wherein the gate driving circuit comprises a plurality of cascaded shift register units; and
at least one transistor comprised in the plurality of shift register units is the transistor having a channel length greater than 1000 microns.

17. The display panel according to claim 16, wherein each of the plurality of shift register units comprises an output transistor, an output pull-down transistor, an input transistor, an input reset transistor, and a storage capacitor;
a control electrode of the output transistor is electrically coupled with a pull-up node, a first electrode of the output transistor is electrically coupled with a clock signal line, and a second electrode of the output transistor is electrically coupled with a gate drive signal output terminal;
a control electrode of the output pull-down transistor is electrically coupled with a reset terminal, a first electrode of the output pull-down transistor is electrically coupled with the gate drive signal output terminal, and a second electrode of the output pull-down transistor is electrically coupled with a first voltage terminal;
a control electrode of the input transistor and a first electrode of the input transistor are electrically coupled with an input terminal, and a second electrode of the input transistor is electrically coupled with the pull-up node;
a control electrode of the input reset transistor is electrically coupled with the reset terminal, a first electrode of the input reset transistor is electrically coupled with the pull-up node, and a second electrode of the input reset transistor is electrically coupled with the first voltage terminal;
a first electrode plate of the storage capacitor is electrically coupled with the control electrode of the output transistor, and a second electrode plate of the storage capacitor is electrically coupled with the second electrode of the output transistor; and at least one of the output transistor, the output pull-down transistor, the input transistor, or the input reset transistor is the transistor having a channel length greater than 1000 microns.

18. The display panel according to claim 16, wherein a storage capacitor in each of the plurality of shift register units comprises a first electrode plate and a second electrode plate, and the second electrode plate comprises at least one electrode plate portion; and the at least one electrode plate portion is adjacent to at least one of the plurality of transistor regions.

19. The display panel according to claim 18, wherein the display panel has a plurality of capacitor regions arranged at intervals, the second electrode plate comprises a plurality of electrode plate portions, and each of the plurality of electrode plate portions is located in one of the plurality of capacitor regions.

20. The display panel according to claim 18, wherein the plurality of transistor regions and the plurality of capacitor regions are alternately arranged, the first transistor region or the second transistor region is arranged between a first capacitor region and a second capacitor region in the plurality of capacitor regions.

* * * * *